United States Patent
Hailey et al.

(10) Patent No.: US 8,680,792 B2
(45) Date of Patent: *Mar. 25, 2014

(54) ACCELERATOR HAVING ACCELERATION CHANNELS FORMED BETWEEN COVALENTLY BONDED CHIPS

(71) Applicant: Transmute, Inc, Los Gatos, CA (US)

(72) Inventors: Kim L. Hailey, Los Gatos, CA (US); Robert O. Conn, Hakalau, HI (US)

(73) Assignee: Transmute, Inc., Los Gatos, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/960,887

(22) Filed: Aug. 7, 2013

(65) Prior Publication Data

US 2014/0049193 A1 Feb. 20, 2014

Related U.S. Application Data

(63) Continuation of application No. 13/585,833, filed on Aug. 15, 2012, now Pat. No. 8,519,644.

(51) Int. Cl.
*H05H 7/00* (2006.01)

(52) U.S. Cl.
USPC ........... 315/506; 315/500; 315/501; 315/503; 315/504; 315/505; 315/507

(58) Field of Classification Search
USPC ................... 315/500–506; 250/423
See application file for complete search history.

(56) References Cited

U.S. PATENT DOCUMENTS

| | | | |
|---|---|---|---|
| 6,555,898 B2 | 4/2003 | Wensel | 257/667 |
| 7,710,051 B2 | 5/2010 | Caporaso et al. | 315/505 |
| 7,791,291 B2 * | 9/2010 | Gorrell | 315/501 |
| 8,220,487 B2 | 7/2012 | Unger et al. | 137/614.11 |

(Continued)

FOREIGN PATENT DOCUMENTS

WO  WO 2010065702  12/2008

OTHER PUBLICATIONS

Gustafsson et al., "An Electrochromatography chip with integrated waveguides for UV absorbance detection," Journal of Micromechanics and Microengineering, vol 18, p. 055021(7) (2008) pp. 1-6.

(Continued)

*Primary Examiner* — Douglas W Owens
*Assistant Examiner* — Srinivas Sathiraju
(74) *Attorney, Agent, or Firm* — Imperium Patent Works; T. Lester Wallace; Darien K. Wallace

(57) ABSTRACT

An accelerator assembly includes a first chip and a second chip. An acceleration channel is formed into a surface of a first side of the first chip. The first side of the first chip is covalently bonded to a first side of the second chip such that the channel is a tubular void between the first and second chips. The channel has a tubular inside sidewall surface, substantially no portion of which is a metal surface. The channel has length-to-width ratio greater than five, and a channel width less than one micron. There are many substantially identical channels that extend in parallel between the first and second chips. In one specific example, the assembly is part of a Direct Write On Wafer (DWOW) printing system. The DWOW printing system is useful in semiconductor processing in that it can direct write an image onto a 300 mm diameter wafer in one minute.

20 Claims, 35 Drawing Sheets

SECTION E-E – DRIFT CELL 2 SIDE VIEW

(56) References Cited

U.S. PATENT DOCUMENTS

| | | | |
|---|---|---|---|
| 8,222,086 B2 | 7/2012 | Conn | 438/119 |
| 8,410,729 B2 * | 4/2013 | Spencer et al. | 315/501 |
| 8,519,644 B1 * | 8/2013 | Hailey et al. | 315/506 |
| 8,541,757 B1 * | 9/2013 | Hailey et al. | 250/423 R |
| 8,564,225 B1 * | 10/2013 | Hailey et al. | 315/506 |
| 8,575,867 B2 * | 11/2013 | Lal et al. | 315/500 |
| 2012/0037814 A1 | 2/2012 | Lal et al. | 250/396 ML |
| 2012/0133306 A1 | 5/2012 | Seliger et al. | 315/506 |
| 2012/0161673 A1 | 6/2012 | Heid et al. | 315/506 |
| 2013/0009322 A1 | 1/2013 | Conn et al. | 257/774 |

OTHER PUBLICATIONS

Marshall et al., "Analysis of a Symmetric Terahertz Dielectric-Lined Rectangular Structure for High Gradient Acceleration," Advanced Accelerator Concepts, American Institute of Physics, Conf. Proc. vol. 1086 (2009) pp. 421-426.

* cited by examiner

WAFER STEPPER

OPTICAL PROXIMITY CORRECTION

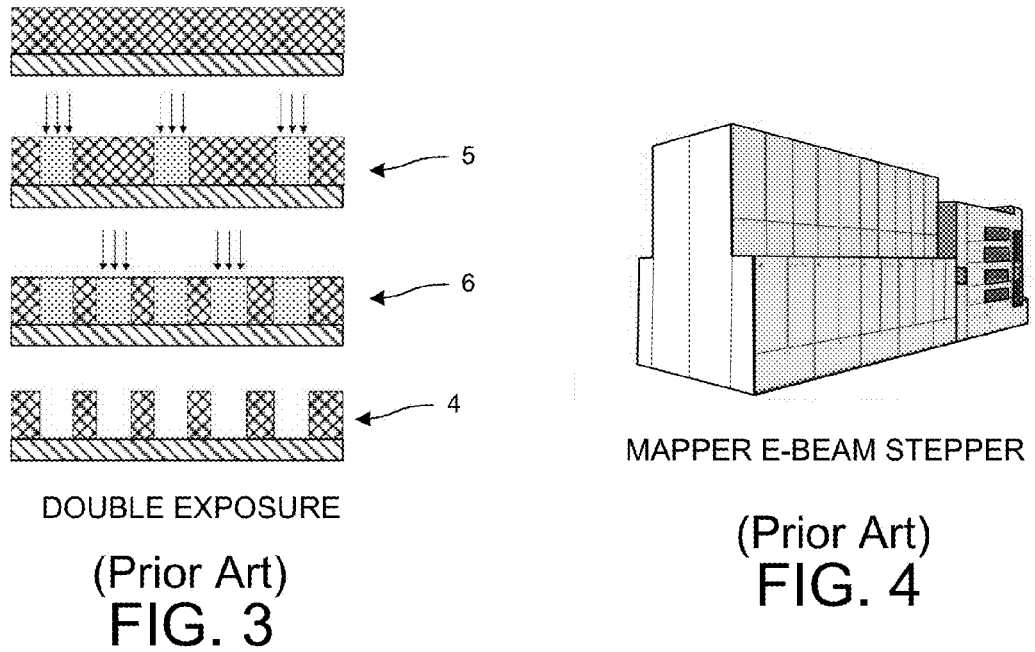
DOUBLE EXPOSURE
(Prior Art)
FIG. 3
MAPPER E-BEAM STEPPER
(Prior Art)
FIG. 4
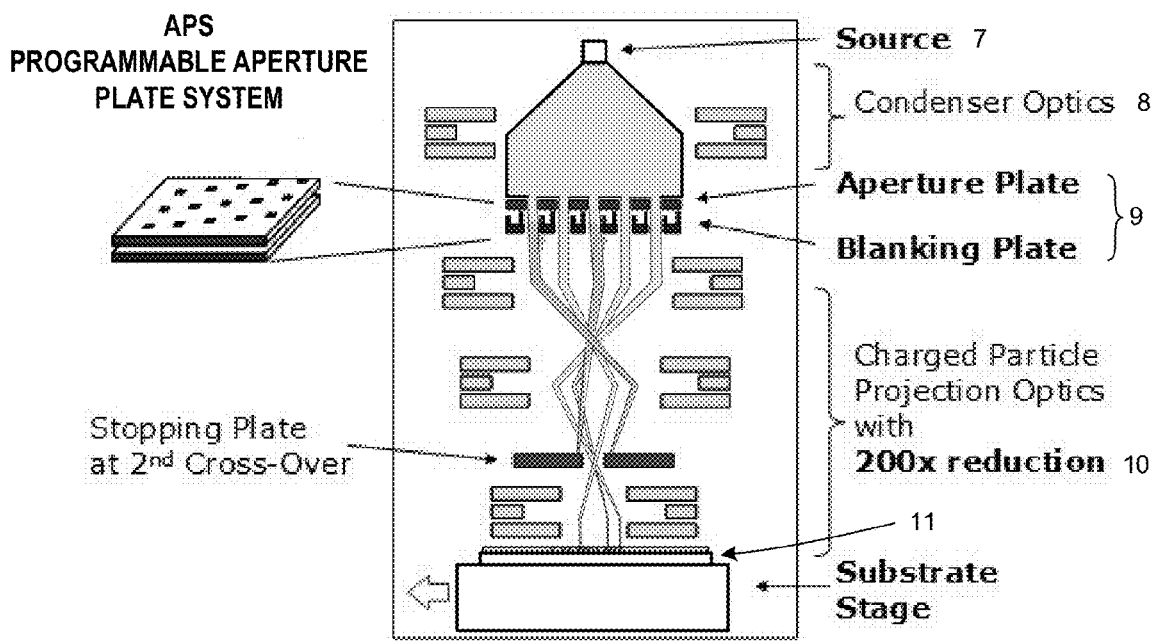
PROTON BEAM STEPPER
(Prior Art)
FIG. 5

SYSTEM OVERVIEW

WAFER PRINTER
(TOP-DOWN VIEW)

WAFER PRINTER
(SIDE VIEW)

IONJET HEAD ASSEMBLY

IONJET HEAD

SYSTEM DATA PATH

DETAIL A - PROTON BEAM DYNAMICS

X-Y POSITIONING

PROTON DENSITY IN THE CHANNEL

| ACCELERATOR | ION INJECTOR | LOGIC CHIP | CHANNEL CHIP | DRIVER |
|---|---|---|---|---|
| X=27.0mm | X=26.0mm | X=26.0mm | X=27.0mm | X=25.0mm |
| Y=48.0mm | Y=7.0mm | Y=41.0mm | Y=44.0mm | Y=48.0mm |
| Z=0.7mm | Z=7.0mm | Z=0.35mm | Z=0.35mm | Z=2.0mm |

IONJET HEAD SCHEMATIC

ACCELERATOR ASSEMBLY

SECTION A-A IONJET HEAD SIDE VIEW
SHOWN COMPRESSED

DETAIL E - ION INJECTOR

DETAIL F - ION INJECTOR (EXPLODED VIEW)

SECTION B-B ACCELERATOR BONDING SCHEME

DETAIL H - CHANNEL

| cell | kinetic energy (eV) | avg vel. v (μ/ns) | μ/ns | length- μ | gap- μ | |
|---|---|---|---|---|---|---|
|  | 1 | 14 | 7 | 11.1 | 1.4 | DRIFT PLATE CELLS 1-3 |
| 1 | 70 | 116 | 65 | 92.7 | 13.0 | |
| 2 | 140 | 164 | 140 | 131.1 | 28.0 | |
| 3 | 210 | 201 | 182 | 160.6 | 36.5 | |
| 4 | 280 | 232 | 216 | 185.4 | 43.3 | |
| 5 | 350 | 259 | 245 | 207.3 | 49.1 | 1GHZ D1-1, D1-2 DRIFT PLATE |
| 6 | 420 | 284 | 272 | 227.1 | 54.3 | |
| 7 | 490 | 307 | 295 | 245.3 | 59.1 | |
| 8 | 560 | 328 | 317 | 262.3 | 63.4 | |
| 9 | 630 | 348 | 338 | 278.2 | 67.6 | |
| 10 | 700 | 367 | 357 | 293.2 | 71.4 | |
| 11 | 770 | 384 | 375 | 153.8 | 37.5 | |
| 12 | 840 | 401 | 393 | 160.6 | 39.3 | |
| 13 | 910 | 418 | 410 | 167.2 | 41.0 | |
| 14 | 980 | 434 | 426 | 173.5 | 42.6 | |
| 15 | 1050 | 449 | 441 | 179.6 | 44.1 | |
| 16 | 1120 | 464 | 456 | 185.4 | 45.6 | |
| 17 | 1190 | 478 | 471 | 191.1 | 47.1 | |
| 18 | 1260 | 492 | 485 | 196.7 | 48.5 | |
| 19 | 1330 | 505 | 498 | 202.1 | 49.8 | 2GHZ D2-1, D2-2 DRIFT PLATE |
| 20 | 1400 | 518 | 442 | 207.3 | 44.2 | |
| 21 | 1470 | 531 | 458 | 212.4 | 45.8 | |
| 22 | 1540 | 544 | 473 | 217.4 | 47.3 | |
| 23 | 1610 | 556 | 487 | 222.3 | 48.7 | |
| 24 | 1680 | 568 | 501 | 227.1 | 50.1 | |
| 25 | 1750 | 580 | 514 | 231.8 | 51.4 | |
| 26 | 1820 | 591 | 527 | 236.4 | 52.7 | |
| 27 | 1890 | 602 | 540 | 240.9 | 54.0 | |
| 28 | 1960 | 613 | 553 | 245.3 | 55.3 | |
| 29 | 2460 | 687 | 603 | 274.8 | 60.3 | |
| 30 | 2960 | 754 | 642 | 301.5 | 64.2 | |
| 31 | 3460 | 815 | 679 | 325.9 | 67.9 | |
| 32 | 3960 | 872 | 714 | 348.7 | 71.4 | 2GHZ G1-1, G1-3 PLATE/GRID |
| 33 | 4460 | 925 | 746 | 370.1 | 74.6 | |
| 34 | 4960 | 976 | 778 | 390.2 | 77.8 | |
| 35 | 5460 | 1,024 | 807 | 409.4 | 80.7 | |
| 36 | 5960 | 1,069 | 836 | 427.8 | 83.6 | |

CELL TIMING AND SPACING SPREAD SHEET, PAGE 1/2

FIG. 24A

| | | | | | | |
|---|---|---|---|---|---|---|
| 37 | 6460 | 1,113 | 863 | 445.4 | 86.3 | }  2GHZ G1-1, G1-3 PLATE/GRID |
| 38 | 6960 | 1,156 | 921 | 462.3 | 92.1 | |
| 39 | 7460 | 1,196 | 975 | 478.6 | 97.5 | |
| 40 | 7960 | 1,236 | 961 | 494.4 | 96.1 | |
| 41 | 8460 | 1,274 | 1,255 | 509.7 | 125.5 | |
| 42 | 8960 | 1,311 | 1,293 | 262.3 | 64.6 | |
| 43 | 9460 | 1,347 | 1,329 | 269.5 | 66.5 | PLATE/GRID CELLS 42-44 |
| 44 | 9960 | 1,382 | 1,365 | 276.5 | 68.2 | |
| 45 | 10460 | 1,417 | 1,400 | 283.4 | 70.0 | |
| 46 | 10960 | 1,450 | 1,434 | 290.0 | 71.7 | |
| 47 | 11460 | 1,483 | 1,467 | 296.6 | 73.3 | |
| 48 | 11960 | 1,515 | 1,499 | 303.0 | 74.9 | |
| 49 | 12460 | 1,546 | 1,531 | 309.3 | 76.5 | |
| 50 | 12960 | 1,577 | 1,562 | 315.4 | 78.1 | |
| 51 | 13460 | 1,607 | 1,592 | 321.4 | 79.6 | |
| 52 | 13960 | 1,637 | 1,622 | 327.3 | 81.1 | |
| 53 | 14460 | 1,666 | 1,651 | 333.2 | 82.6 | |
| 54 | 14960 | 1,694 | 1,680 | 338.9 | 84.0 | |
| 55 | 15460 | 1,722 | 1,708 | 344.5 | 85.4 | |
| 56 | 15960 | 1,750 | 1,736 | 350.0 | 86.8 | |
| 57 | 16460 | 1,777 | 1,764 | 355.5 | 88.2 | |
| 58 | 16960 | 1,804 | 1,791 | 360.8 | 89.5 | |
| 59 | 17460 | 1,830 | 1,817 | 366.1 | 90.9 | |
| 60 | 17960 | 1,856 | 1,843 | 371.3 | 92.2 | |
| 61 | 18460 | 1,882 | 1,869 | 376.4 | 93.5 | |
| 62 | 18960 | 1,907 | 1,895 | 381.5 | 94.7 | |
| 63 | 19460 | 1,932 | 1,920 | 386.5 | 96.0 | 4GHZ G2-1, G2-2, G2-3, G2-4 PLATE/GRID |
| 64 | 19960 | 1,957 | 1,945 | 391.4 | 97.2 | |
| 65 | 20460 | 1,981 | 1,969 | 396.3 | 98.5 | |
| 66 | 20960 | 2,006 | 1,994 | 401.1 | 99.7 | |
| 67 | 21460 | 2,029 | 2,017 | 405.9 | 100.9 | |
| 68 | 21960 | 2,053 | 2,041 | 410.6 | 102.1 | |
| 69 | 22460 | 2,076 | 2,064 | 415.2 | 103.2 | |
| 70 | 22960 | 2,099 | 2,088 | 419.8 | 104.4 | |
| 71 | 23460 | 2,122 | 2,110 | 424.4 | 105.5 | |
| 72 | 23960 | 2,144 | 2,133 | 428.9 | 106.7 | |
| 73 | 24460 | 2,167 | 2,155 | 433.3 | 107.8 | |
| 74 | 24960 | 2,189 | 2,178 | 437.7 | 108.9 | |
| 75 | 25460 | 2,210 | 2,199 | 442.1 | 110.0 | |
| 76 | 25960 | 2,232 | 2,221 | 446.4 | 111.1 | |
| 77 | 26460 | 2,253 | 2,243 | 450.7 | 112.1 | |
| 78 | 26960 | 2,275 | 2,264 | 454.9 | 113.2 | |
| 79 | 27460 | 2,296 | 2,285 | 459.1 | 114.3 | |
| 80 | 27960 | 2,316 | 2,306 | 463.3 | 115.3 | |
| 81 | 28460 | 2,337 | 2,327 | 467.4 | 116.3 | |
| 82 | 28960 | 2,357 | 2,347 | 471.5 | 117.4 | |
| 83 | 29460 | 2,378 | 2,368 | 475.5 | 118.4 | |
| 84 | 29960 | 2,398 | 2,388 | 479.6 | 119.4 | |
| 85 | 30460 | 2,418 | 2,408 | 483.5 | 120.4 | |

TIMING SPREAD SHEET

KEY TO FIG. 24

DETAIL B – GATE CELL TOP-DOWN VIEW

SECTION C-C – GATE CELL SIDE VIEW

DETAIL C - DRIFT CELLS TOP VIEW

FIG. 28         NOT TO SCALE

SECTION D-D - DRIFT CELL SIDE VIEW    NOT TO SCALE

SECTION E-E – DRIFT CELL 2 SIDE VIEW

DETAIL E – DRIFT PROTON TIMING SCHEME

DETAIL D – PLATE/GRID CELL TOP VIEW

SECTION F-F – PLATE/GRID CELL SIDE VIEW

SECTION G-G - PLATE/GRID CELL 43 SIDE VIEW

GATE PROTON TIMING SCHEME

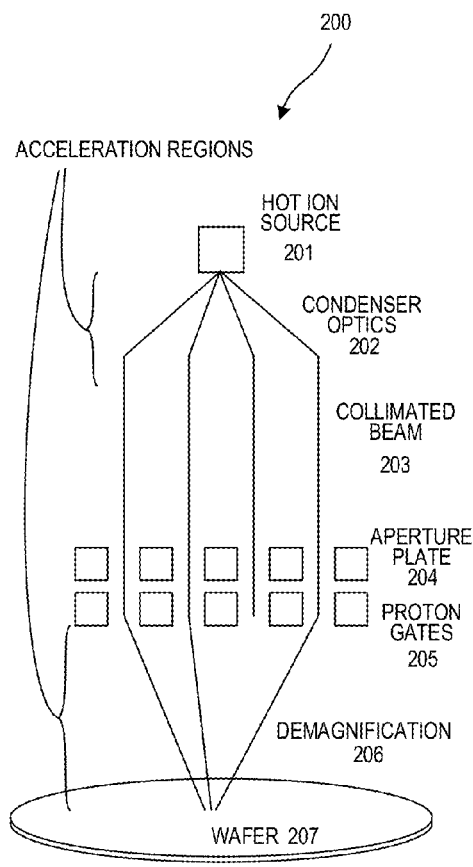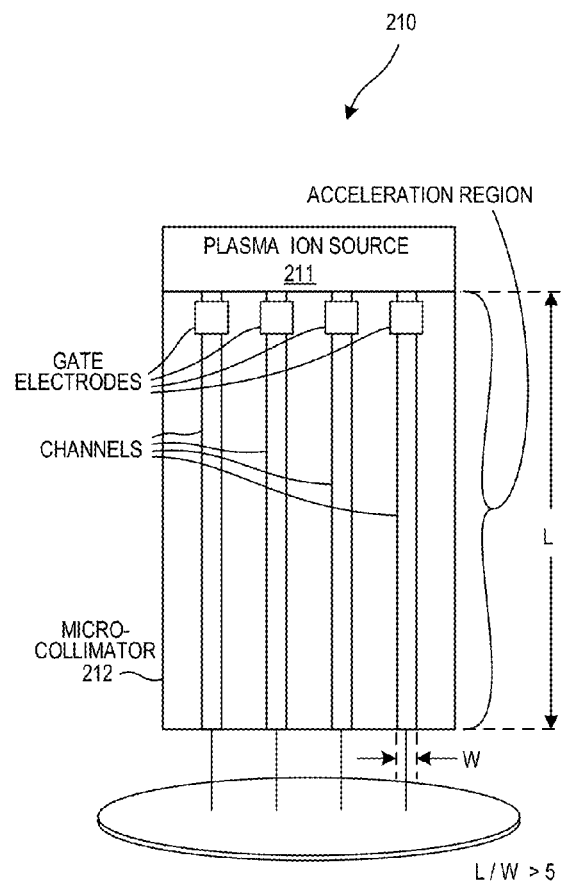
ION SOURCE AND COLLIMATOR
(PRIOR ART)
FIG. 36
ACCELERATOR HAVING A MULTI-CHANNEL MICRO-COLLIMATOR
FIG. 37

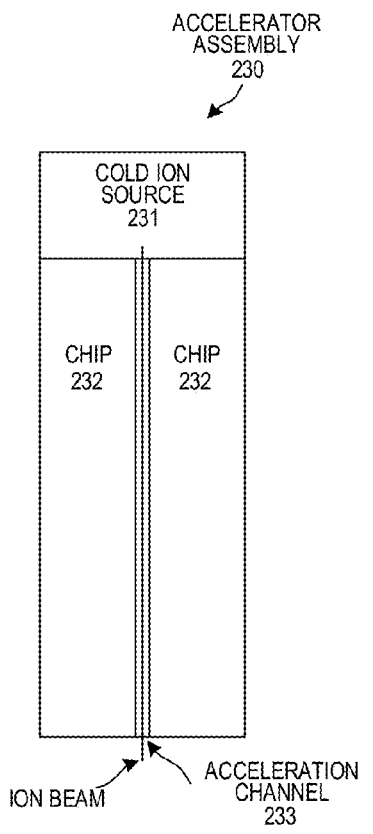
FIG. 38 — ACCELERTOR ON A CHIP HAVING A COLD ION SOURCE (TOP-DOWN VIEW)
FIG. 39 — ACCELERTOR ON A CHIP HAVING A GRID AND PLATE CELL

ACCELERTOR HAVING ACCELERATION CHANNELS
FORMED BETWEEN COVALENTLY BONDED CHIPS

ACCELERATOR HAVING ACCELERATION CHANNELS FORMED BETWEEN COVALENTLY BONDED CHIPS

CROSS REFERENCE TO RELATED APPLICATIONS

This application is a continuation of, and claims priority under 35 U.S.C. §120 from, nonprovisional U.S. patent application Ser. No. 13/585,833 entitled "Accelerator Having Acceleration Channels Formed Between Covalently Bonded Chips," filed on Aug. 15, 2012, now U.S. Pat. No. 8,519,644, the subject matter of which is incorporated herein by reference.

TECHNICAL FIELD

The described embodiments relate generally to the field of particle accelerators, and more particularly to a Direct Write On Wafer (DWOW) printing system employing a micro-collimated proton accelerator.

BACKGROUND INFORMATION

A semiconductor manufacturing process is a series of steps that make the various layers and structures of an integrated circuit. Each layer of the integrated circuit is made using one or more masks. A mask defines the features of the layer. To realize one of the layers, a semiconductor wafer is coated with a thin layer of liquid photosensitive resist (also called "photoresist" or simply "resist").

FIG. 1 (Prior Art) is a diagram of a conventional wafer stepper that uses light. The wafer stepper projects laser light through a mask to expose parts of the photoresist and to leave other parts of the photoresist unexposed. Generally areas of photoresist that are exposed harden. The unhardened photoresist is washed away, leaving a pattern of hardened photoresist. The hardened areas of photoresist protect the underlying areas of the integrated circuit during a subsequent manufacturing step. After the subsequent manufacturing step has been performed, the hardened photoresist layer is stripped away. Another layer of liquid photoresist is applied to the integrated circuit being formed. In this way, a typical semiconductor manufacturing process uses many masks and many associated manufacturing steps.

Semiconductor manufacturing processes are generally referred to in terms of the smallest feature size that can be made using the process. A so-called 20 nm CMOS process can make a field effect transistor gate having a gate length of 20 nm. This 20 nm is the distance across the channel between the source and drain diffusion regions. This distance needs to be well controlled. Currently photolithographic techniques employing 193 nm wavelength light are usable to make 20 nm wide gates. Using such photolithography, it is possible to make 20 nm wide parallel strip-shaped features at 100 nm pitch, where the 100 nm pitch does not vary more than 1 nm. The width of each parallel strip is also well controlled along the length of the strip. A problem, however, exists when small corners of hardened photoresist are to be made, and when the ends of narrows strips of hardened photoresist are to be made. The wavelength of the laser light used to expose the photoresist through the mask is so large compared to the size of the corner, that light diffraction through the mask causes a large variation in edge definition. To cope with such edge definition problems in a 20 nm process, OPC (Optical Proximity Correction) techniques are generally used on each photoresist mask.

FIG. 2 (Prior Art) is a diagram that shows a desired structure 1 of hardened photoresist. This structure 1 has small corners. If a mask is used that has the shape of the designed structure, then rather than forming the designed structure with its sharp corners, an unacceptably distorted structure will be formed. To prevent this distortion, an odd looking OPC structure 2 is used as the mask. Due to complex diffraction effects, use of the OPC mask 2 results in the photoresist being exposed such that the hardened photoresist has a shape 3 that is closer to the desired shape 1.

Another problem often encountered occurs when imaging adjacent structures that have incompatible densities or pitches. FIG. 3 (Prior Art) is a simplified cross-sectional diagram that illustrates a set of features 4 having a pitch that is too fine to print. These features are shown in the bottom row of the diagram. This problem is solved by exposing the photoresist with multiple masks, where each mask has half the desired feature pitch or density. In FIG. 3, reference numerals 5 and 6 identify two such masks. For these reasons, many OPC masks and double exposure masks may be involved in a semiconductor process.

It is a general objective of semiconductor device manufacture to make the logic transistors smaller and smaller so that more logic transistors can be realized on an integrated circuit for a given cost of manufacture. If feature size is reduced, then the number of masks increases because multiple exposure steps are required. For example, to reduce feature size in a commercial high volume wafer fabrication facility from 45 nm to 20 nm, the number of mask steps was seen to increase from about thirty masks to as many as seventy masks. In one projected commercial semiconductor fabrication facility, a separate stepper will be used for each masking step so that the overall facility will have the desired wafer throughput. A fewer number of steppers could be used so that one stepper could be used to perform multiple masking steps, but then overall factory throughput would decrease.

A state of the art stepper of a type usable in a 20 nm process of the semiconductor fabrication facility described above may cost about 125 million dollars. Such a facility may require twenty-five steppers, making the cost of procuring wafer steppers a dominant cost of the entire fabrication facility. Making matters still worse, the number of steppers required is seen to increase with decreasing feature size. If feature size is to be reduced below 20 nm in the future, factory cost may be prohibitive.

To get around these problems, alternatives to conventional light photolithography have been proposed. These alternatives include: 1) extreme ultraviolet (EUV), 2) electron beam (e-beam), and 3) proton beam (p-beam) lithography. Making satisfactory EUV (soft X-ray) light sources is very challenging. The brightness and efficiency of EUV light sources are low. EUV stepper technology is still immature. FIG. 4 (Prior Art) is a diagram of an E-beam stepper. E-beam steppers are in experimental use but are generally only used for mask making and in pilot runs for research purposes. Both EUV and e-beam technologies can damage the underlying semiconductor wafer, and this damage may affect yield and reliability of the integrated circuits being manufactured.

P-beam lithography has been tried and has several benefits. Protons are large and heavy compared to electrons and do not travel very deeply into photoresist. As a result, protons generally do not damage the underlying wafer. When the protons strike the photoresist, they are slowed and create a cloud of slow speed collateral electrons. These slow speed collateral electrons in turn expose negative photoresist. As a result of this mechanism, a proton beam can expose a very small spot size thereby facilitating high resolution lithography. In positive photoresists, the proton beam breaks cross-linking bonds. Photoresists exist that are about one hundred times more sensitive to a proton beam than to an electron beam of the same energy. This increased sensitivity allows the use of less expensive photoresists as compared to the types of expensive photoresists used in e-beam lithography. Despite these advantages, attempts to commercialize p-beam technology have not been successful.

FIG. 5 (Prior Art) is a schematic illustration of a p-beam stepper that has a proton source 7. Protons emitted from this source 7 are then collimated by condenser optics 8 and are directed to an aperture and blanking plates 9. This breaks up the flow of protons into individual beams. The individual beams are then de-magnified with a 200× reduction 10 down to the wafer 11. It is very difficult to collimate protons because they are repelled from each other due their positive charges. This repulsion results in the protons separating from one another in the lateral dimension. Moreover, because the protons are initially produced by a hot ion source, the protons may have large initial lateral momentums. These effects result in serious focusing problems and make generating adequately collimated proton beams difficult.

SUMMARY

A Direct Write On Wafer (DWOW) printing system includes a control computer and a wafer printer. The control computer stores a virtual image such as a virtual image for exposing photoresist on a wafer in a masking step of a semiconductor manufacturing process. The wafer printer in one specific example includes an ionjet head assembly that in turn includes many thousands of miniature proton accelerators. A positioning mechanism of the wafer printer can provide relative movement between the wafer and the ionjet head assembly. The control computer controls the wafer printer such that the virtual image is written onto the wafer by successively writing lines of spots as the wafer is moved back and forth with respect to the ionjet head assembly. The structure of the DWOW printing system is described, a method of making the system is described, and a method of operation of the system is described.

In one specific example, the virtual image is written in an area of at least 90,000 square millimeters in less than one minute by selectively irradiating individual spots with a spot irradiation of at least 0.2 picojoules, where each individual spot has a spot size of approximately 5 nm. If an individual 5 nm spot of photoresist is to be irradiated as indicated by the virtual image, then the spot is irradiated with approximately 40 protons, where the protons have an average energy of 10 KeV. If the individual 5 nm spot of photoresist is not to be irradiated as indicated by the virtual image, then proton flow out of the proton accelerator that would otherwise have emitted protons onto the spot is gated off. The DWOW printing system is useful in semiconductor processing in that it can direct write the virtual image onto a 300 mm diameter wafer in one minute.

In a first novel aspect, an ion accelerator includes a plasma ion source and a micro-collimator. The micro-collimator has a plurality of channels. The length-to-width ratio of each channel is greater than five, and the channel width is less than one micron. The ion source is coupled to the micro-collimator such that ions from the ion source pass into the channels, and then through the plurality of channels. In one specific example, the ion source produces cold ions that have an energy less than 30 eV and that have only a small amount of lateral momentum. Each channel is an individually gated acceleration channel that is formed in a solid dielectric material. Ions are accelerated down the acceleration channel. The ion accelerator forms a part of an ionjet head of a Direct Write On Wafer (DWOW) printing system. The DWOW printing system is useful in semiconductor processing in that it can direct write an image onto a 300 mm diameter wafer in one minute.

In a second novel aspect, an assembly includes a cold ion source and a chip. The cold ion source is fixed to the chip so that ions from the ion source can enter an acceleration channel in the chip. In one specific example, the ion source includes an ion exchange membrane that produces cold ions in that the ions as produced have an average energy less than 30 eV, and such that substantially no ions produced have an energy more than 30 eV. The chip includes a substrate (such as a semiconductor substrate or a glass substrate) and a dielectric layer disposed on substrate, where the acceleration channel is a channel formed into the dielectric layer. Ions exit the acceleration channel having an energy of at least 1 KeV. In one specific example, the assembly is part of a Direct Write On Wafer (DWOW) printing system. The DWOW printing system is useful in semiconductor processing in that it can direct write an image onto a 300 mm diameter wafer in one minute.

In a third novel aspect, an accelerator assembly includes an acceleration channel that passes in a straight line through a plurality of accelerator cells. Each cell includes an acceleration region and a drift region. The drift region includes a high voltage plate and a grid electrode, where the grid electrode is disposed between the high voltage plate and the channel. In each accelerator cell, a large DC voltage is present on the high voltage plate. A voltage on the grid electrode is controlled such that at a first time an ion in the channel is attracted toward the high voltage plate of the accelerator cell, and such that at a second time the ion is shielded and is not attracted toward the high voltage plate of the accelerator cell. In one specific example, the assembly is part of a Direct Write On Wafer (DWOW) printing system that can direct write an image onto a 300 mm diameter wafer in one minute.

In a fourth novel aspect, an accelerator assembly includes a first chip and a second chip. An acceleration channel is formed into a surface of a first side of the first chip. The first side of the first chip is covalently bonded to a first side of the second chip such that the channel is a tubular void between the first and second chips. The channel has a tubular inside dielectric sidewall surface, no portion of which is a metal surface. The tube can have a circular, square, or rectangular cross section. The channel has length-to-width ratio greater than five, and a channel width less than one micron. There are many substantially identical channels that extend in parallel between the first and second chips. In one specific example, the accelerator assembly is part of a Direct Write On Wafer (DWOW) printing system. The DWOW printing system is useful in semiconductor processing in that it can direct write an image onto a 300 mm diameter wafer in one minute.

In a fifth novel aspect, a Direct Write On Wafer (DWOW) printing system includes a computer system that stores a virtual image and a means for writing. The means for writing can write the virtual image in an area of at least 90,000 square millimeters in less than one minute by selectively irradiating individual spots with a spot irradiation of at least 0.2 picojoules, where each individual spot has a spot size of 5 nm or less. The virtual image is written by successively writing lines of spots. In one specific example, the DWOW printing system includes a large number of individually controllable miniature proton accelerators. The ion exit ports of the proton accelerators are separated from the surface to be written by less than one millimeter. A proton beam has a beam diameter less than twenty nanometers at the ion exit port of the proton accelerator. If an individual 5 nm spot is to be irradiated as indicated by the virtual image, then the spot is irradiated by one of the miniature proton accelerators with approximately 40 protons, where the protons have an energy of approximately 10 KeV or more. If the individual 5 nm spot is not to be irradiated as indicated by the virtual image, then proton flow out of the channel that would otherwise have emitted irradiated the spot is gated off. The DWOW printing system is useful in semiconductor processing in that it can direct write an image onto a 300 mm diameter wafer in one minute.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 3 (Prior Art) is a simplified cross-sectional diagram that illustrates how multiple exposures can be used to realize a set of features that have a pitch that is too fine to print using a single exposure.

FIG. 4 (Prior Art) is a perspective diagram of an E-beam stepper.

FIG. 5 (Prior Art) is a diagram of a proton beam stepper.

FIGS. 24A-B are a table that shows, for each accelerator cell, the kinetic energy and velocity of a proton bunch as it exits the cell.

FIG. 36 (Prior Art) is a diagram showing a prior attempt at making a proton accelerator 200 for direct write on wafer applications.

FIG. 37 is a diagram of assembly 210 in abstracted form.

FIG. 38 is a diagram of accelerator assembly 230 in abstracted form.

FIG. 39 is a diagram of accelerator assembly 240 in abstracted form.

DETAILED DESCRIPTION

Reference will now be made in detail to background examples and some embodiments of the invention, examples of which are illustrated in the accompanying drawings. In the description and claims below, relational terms (such as "front", "back", "horizontal", "vertical", "lateral", "top", "upper", "bottom", "lower", "right", "left", "over" and "under") may be used to describe relative orientations between different parts of a structure being described, and it is to be understood that the overall structure being described can actually be oriented in any way in three-dimensional space.

Figure 1:
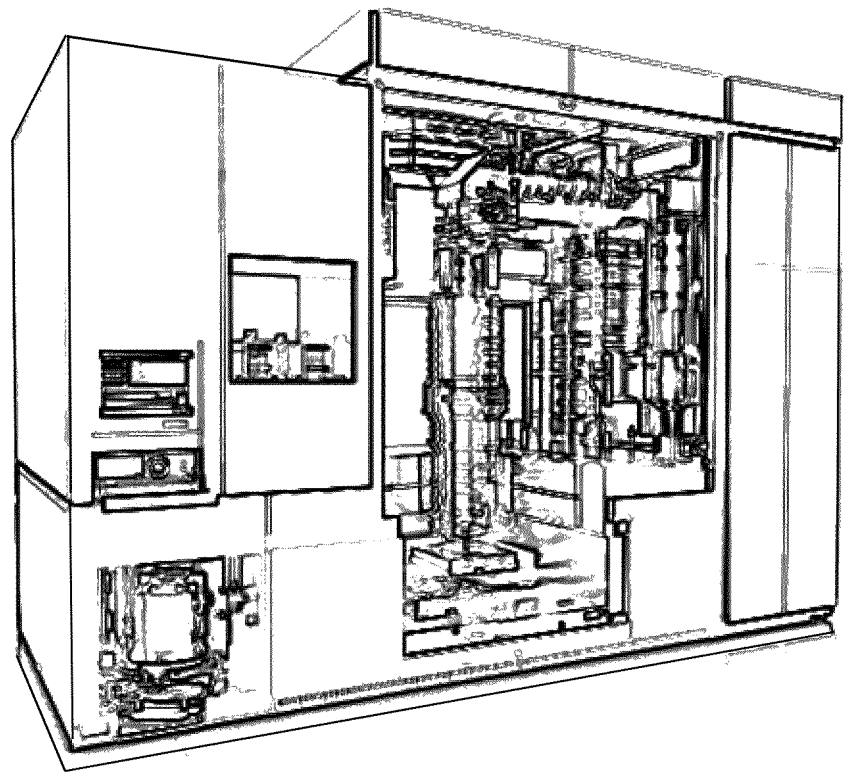
FIG. 1 (Prior Art) is a perspective diagram of a conventional wafer stepper that uses light.
Figure 2:
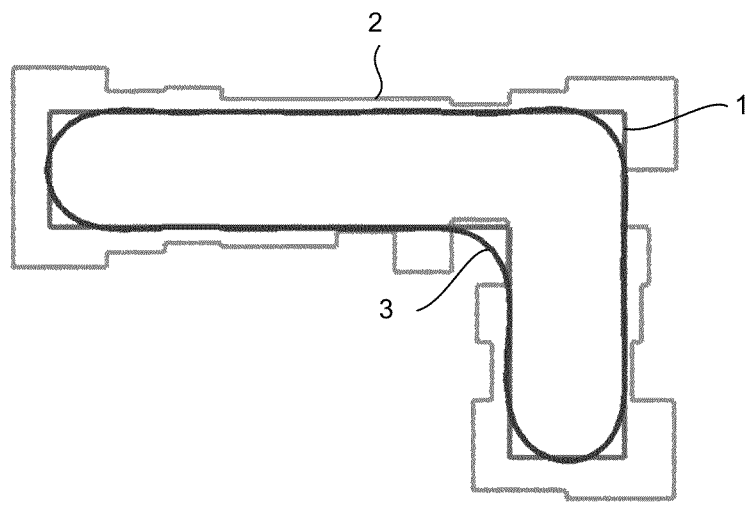
FIG. 2 (Prior Art) is a diagram that illustrates how optical proximity correction techniques can be used to create a desired structure of hardened photoresist that has corners.
Figure 6:
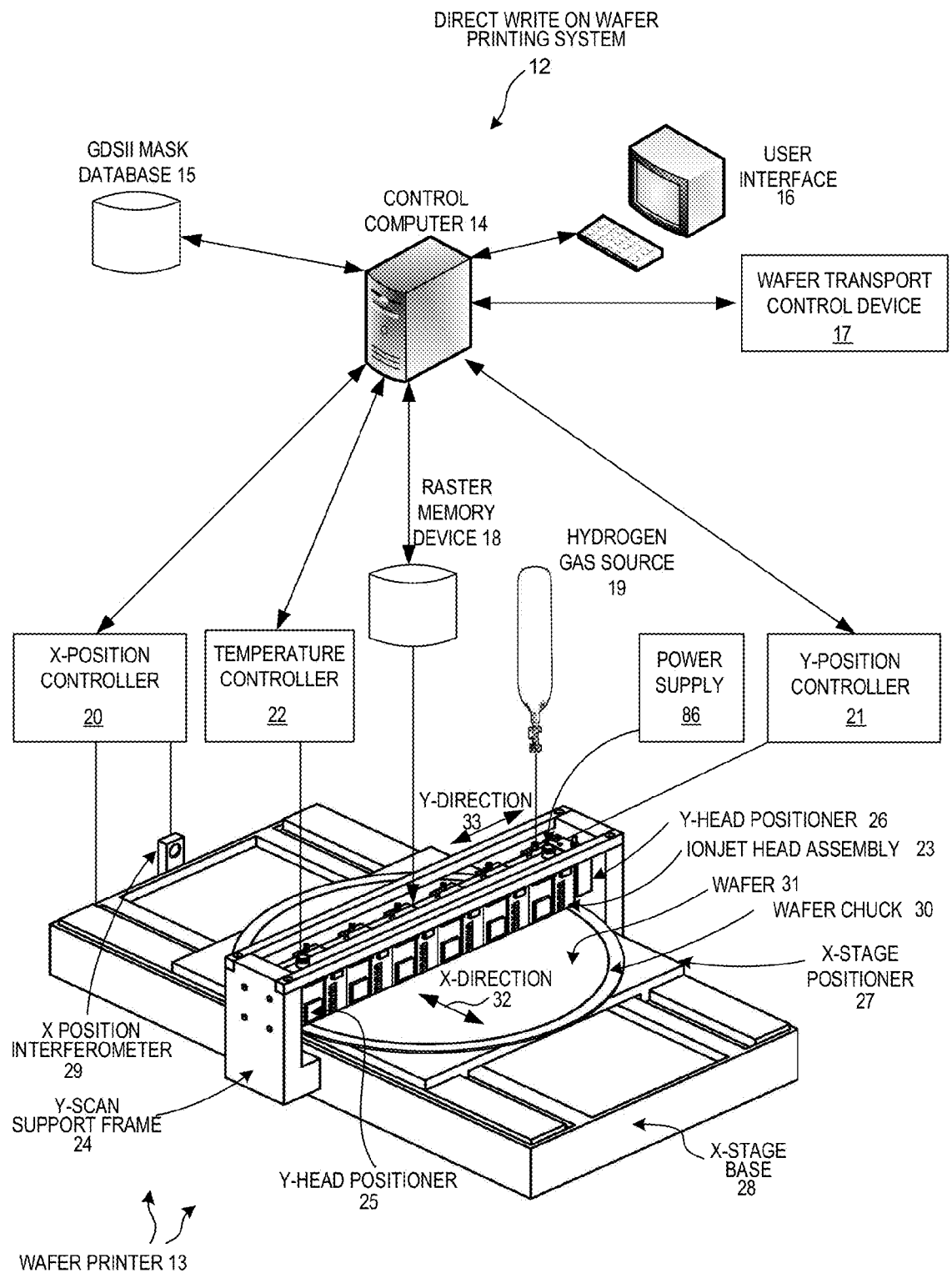
FIG. 6 is a perspective view of a Direct Write On Wafer (DWOW) printing system 12 in accordance with one novel aspect.

FIG. 6 is a perspective view of a Direct Write On Wafer (DWOW) printing system 12 in accordance with one novel aspect. DWOW printing system 12 includes a wafer printer 13, a control computer 14, a GDSII mask database 15, a user interface device 16, a wafer transport control device 17, a raster memory device 18, a hydrogen gas source 19, and a power supply 86. An expansion card within control computer 14 includes an X-position controller 20, a Y-position controller 21 and a temperature controller 22.

Wafer printer 13 includes an ionjet head assembly 23, Y-scan support frame 24, two Y-head positioners 25 and 26, X-stage positioner 27, X-stage base 28, X-position interferometer 29, and wafer chuck 30. X-position controller 20 moves a wafer 31 in the X-direction 32 relative to ionjet head assembly 23. Y-head positioners 25 and 26 move the ionjet heads in the Y-direction 32 relative to wafer 31. The X-position interferometer 29 determines the position of the X-stage base 28 to within one nanometer. The X-position controller 20 takes the position information and drives the X-stage.

Figure 7:
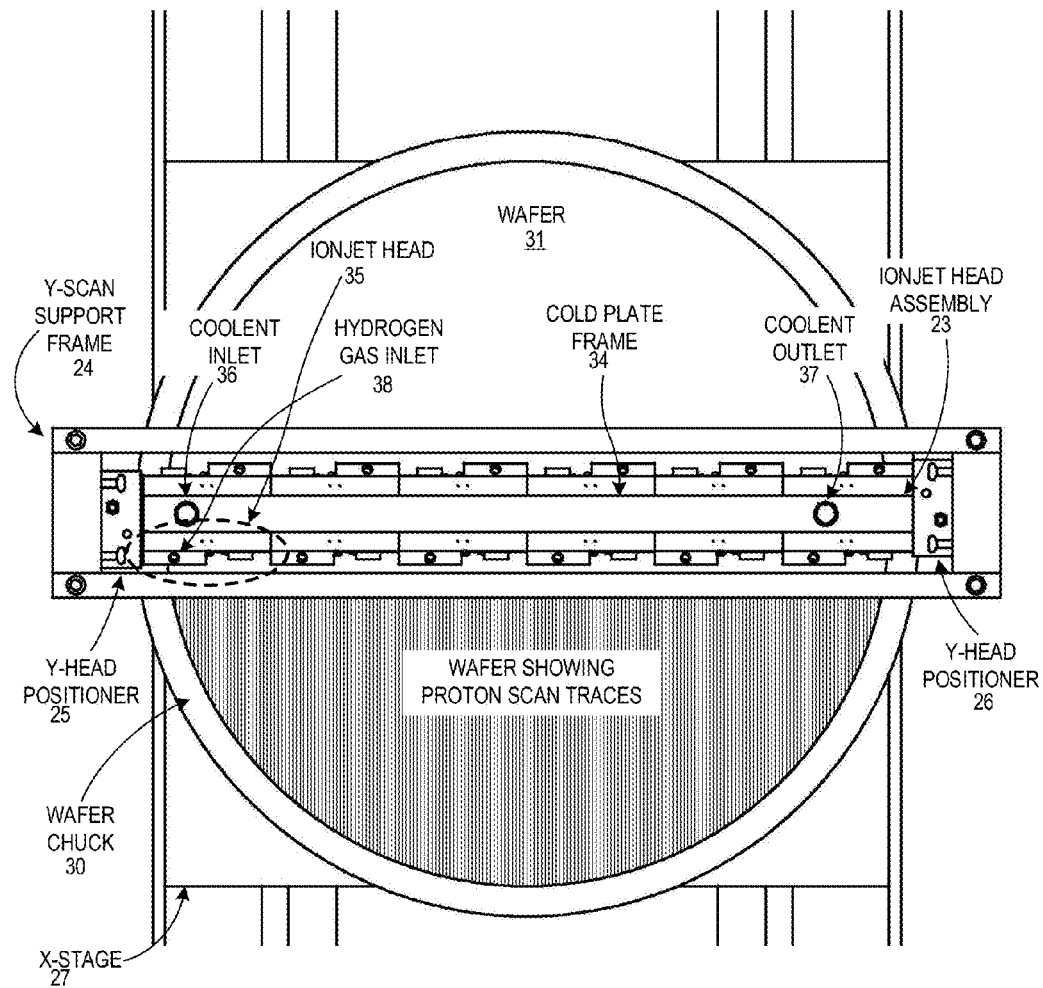
FIG. 7 is a top-down diagram of a portion of the wafer printer 17 of FIG. 6.

FIG. 7 is a top-down diagram of a portion of the wafer printer 13 of FIG. 6. The ionjet head assembly 23 includes a cold plate frame 34 and twelve ionjet heads. Six of the ionjet heads are disposed on the front side of the cold plate frame 34 and the other six of the ionjet heads are disposed on the back side of the cold plate frame 34. Reference numeral 35 identifies the far left front ionjet head that is mounted to the front side of cold plate frame 34. The cold plate frame is a liquid cooled heat sink having an coolant inlet 36 and a coolant outlet 37. Liquid coolant circulates through the cold plate frame through this inlet and outlet. Each of the ionjet head assemblies has a hydrogen gas inlet. Reference numeral 38 identifies the hydrogen gas inlet of ionjet head 35. The Y-head positioners 25 and 26 are piezoelectric actuators that have integrated position sensors accurate to 0.1 nanometers. The position of the ionjet head assembly in the Y-direction 33 is controlled by a DC voltage supplied to the Y-head positioners 25 and 26.

Figure 8:
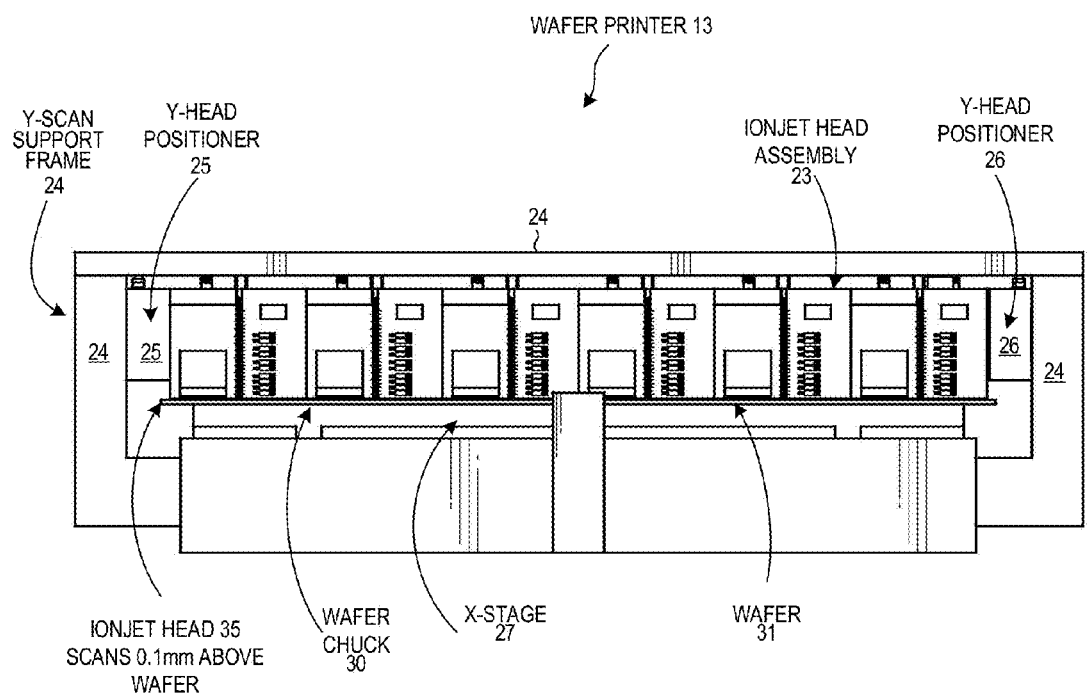
FIG. 8 is a side view of the wafer printer 13 of FIG. 6.

FIG. 8 is a side view of the wafer printer 13 of FIG. 6. The left most ionjet head in the illustration of FIG. 8 is the ionjet head 35 of FIG. 7. Proton beams are emitted out of the bottom side of each of the ionjet heads. Ionjet head assembly 23 is positioned such that proton beam exit ports on the bottom sides of the ionjet heads are approximately 0.1 millimeters above the top surface a photoresist layer on wafer 31. Wafer chuck 30 includes a micro-positioning mechanism that controls the level of wafer 31 in the Z-dimension, and also controls the rotational position of wafer 31 in the θ-dimension.

Figure 9:
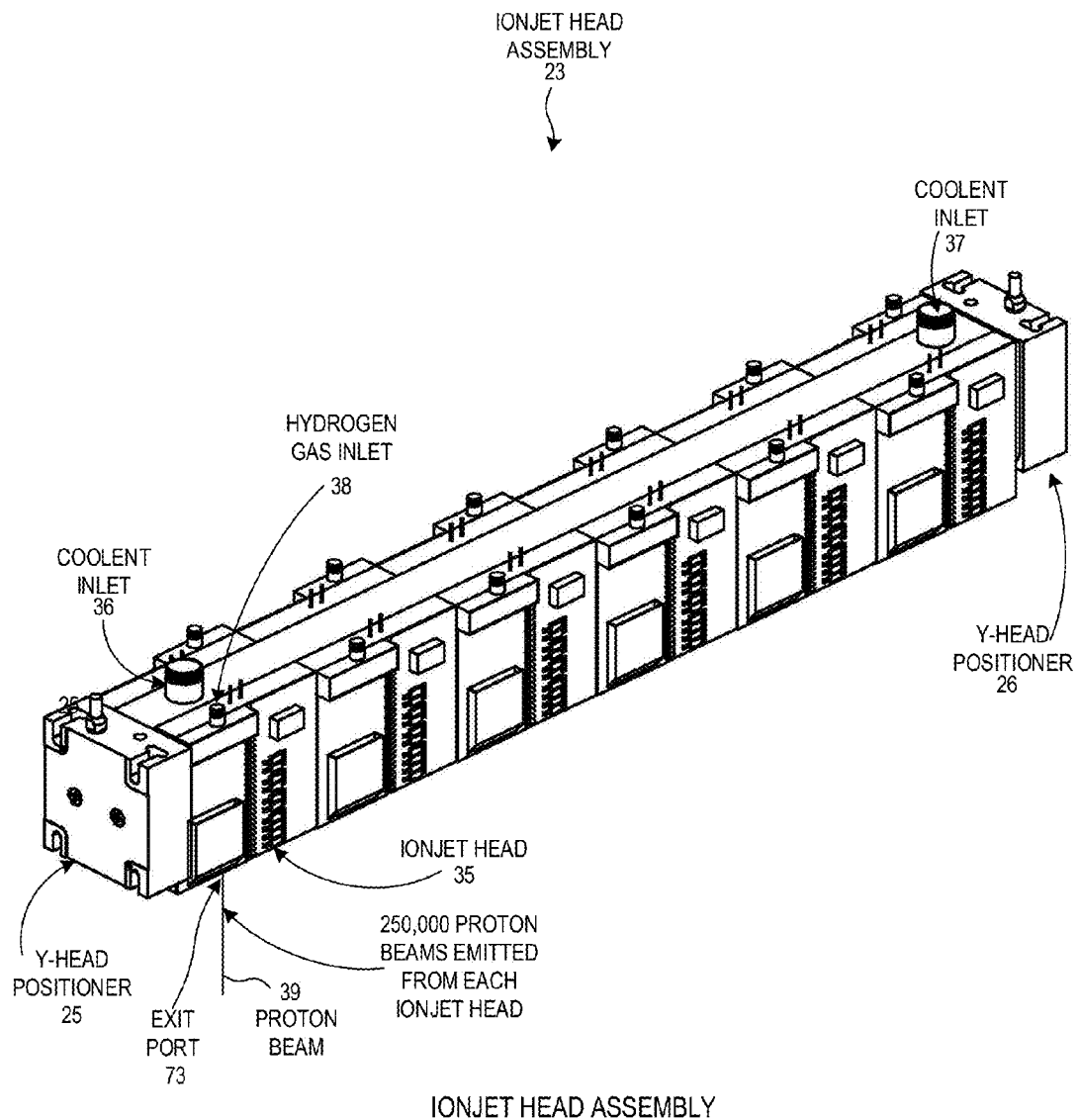
FIG. 9 is a perspective diagram of ionjet head assembly 23 of the wafer printer 13 of the DWOW printing system of FIG. 6.

FIG. 9 is a perspective of ionjet head assembly 23. Each ionjet head outputs 262,144 proton beams. Reference numeral 39 identifies one proton beam that is emitted from exit port 73 of acceleration channel 68 of ionjet head 35.

Figure 10:
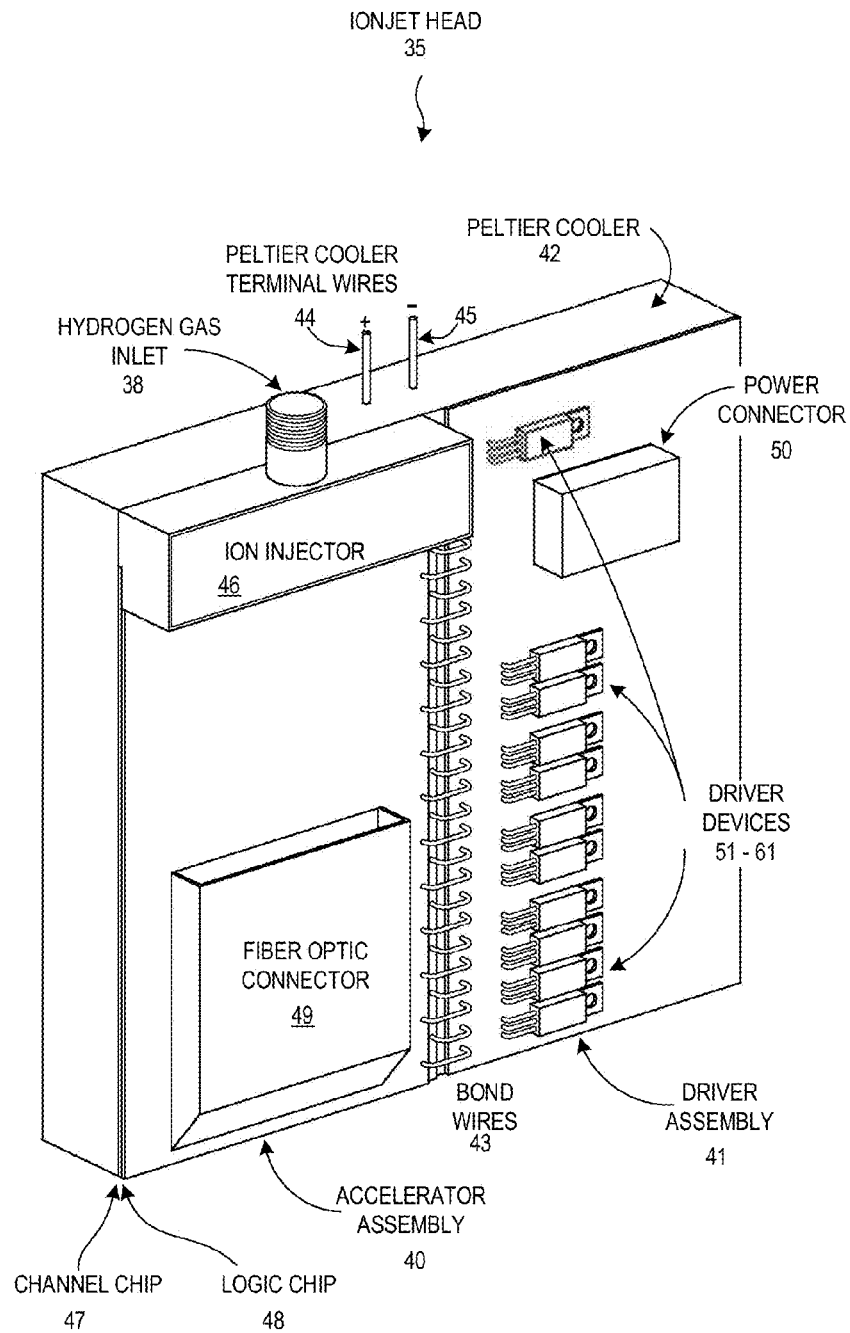
FIG. 10 is a perspective diagram of one of the ionjet heads 35 of the ionjet head assembly 23 of FIG. 9.

FIG. 10 is a perspective view of ionjet head 35. Ionjet head 35 includes an accelerator assembly 40, a driver assembly 41, a Peltier cooler 42, and a plurality of bond wires 43. Peltier cooler 42 is controlled by a current that flows through the Peltier cooler 42 via terminal wires 44 and 45. The Peltier cooler 42 is a thermoelectric cooler that controls the temperature differential between the cold plate frame 34 and the accelerator and driver assemblies 40 and 41. The temperature of the accelerator assembly 40 is maintained to within 0.1 degrees Celsius by temperature controller 22. Accelerator assembly 40 includes ion injector 46, a channel chip 47, a logic chip 48, and a fiber optic connector 49, integrated circuits (not shown) and other components (not shown) mounted to the backside of the logic chip 48. The device side of the channel chip 47 is covalently bonded to the device side of the logic chip 48. The backside of the channel chip 47 is mounted to the Peltier cooler 42. Driver assembly 41 includes a power connector 50, and ten driver devices 51-61.

Figure 11:
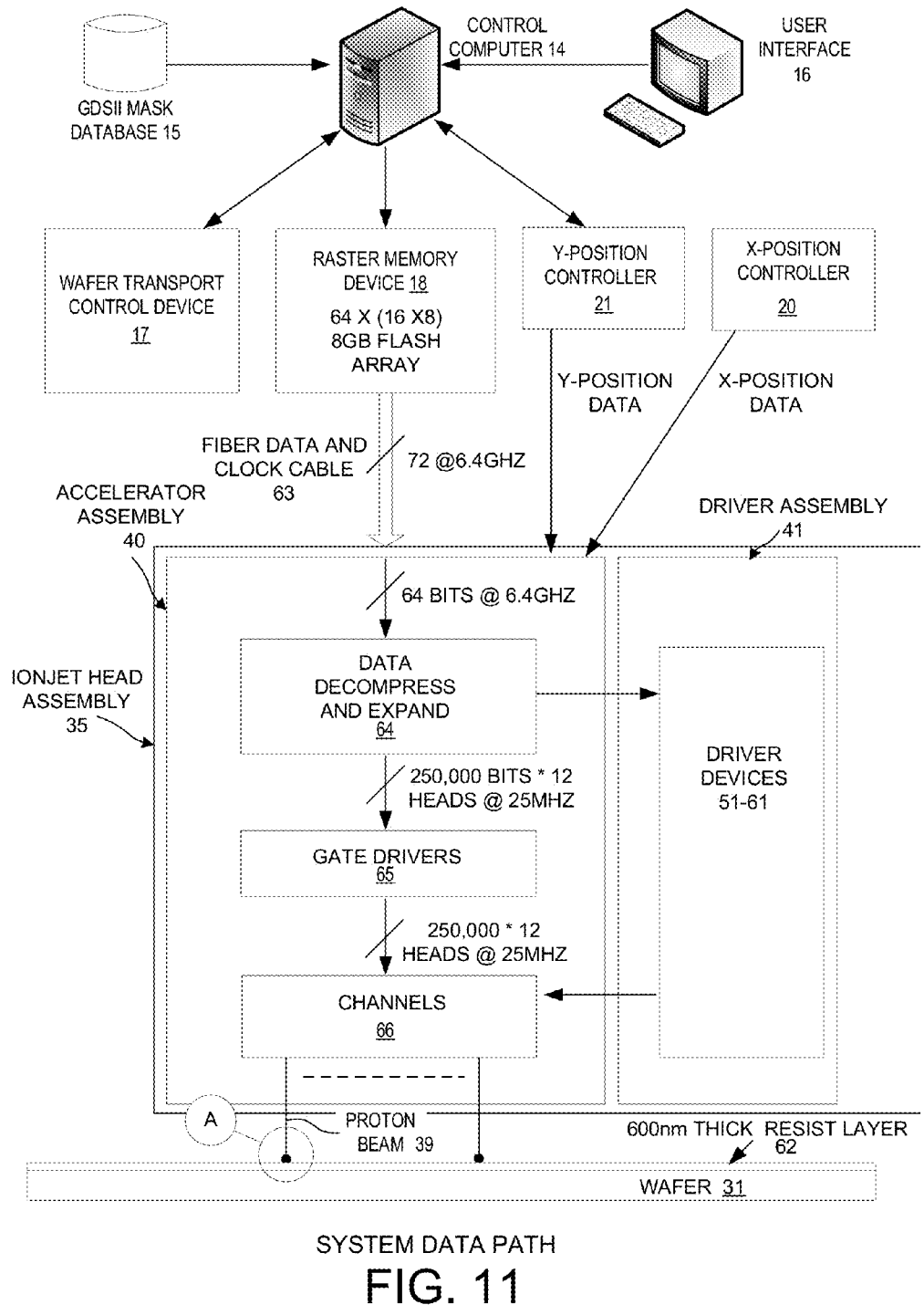
FIG. 11 is a diagram of the data path through the DWOW printing system 12 of FIG. 6.

FIG. 11 is a diagram of the data path through DWOW printing system 12 of FIG. 6. GDSII database 15 includes a GDSII file. For a given mask, the GDSII file defines features composed of polygons. This polygon-based representation is converted into raster image data defining the virtual image. The raster image data defining the virtual image for the mask is sectioned into twelve pieces. Each of these pieces is stored in a corresponding one of twelve raster memory devices. The raster memory device for ionjet head 35 is identified with reference numeral 18. Many terabytes may be required to represent one mask in each raster memory device, where each bit of the raster image data represents one 5 nm diameter spot that will be written by proton beams onto photoresist layer 62. The raster image data is stored in compressed form using a lossless compression algorithm such as LZ77. The compressed raster image data is communicated to ionjet head assembly via twelve 6.4 GHz 72-fiber data and clock cables. There is one such cable 63 for each of the twelve ionjet heads. The fiber optic cable extending to ionjet head 35 is identified with reference numeral 63. Fiber optic cable 63 terminates in fiber optic cable connector 49 of the accelerator assembly 40 of ionjet head 35. There is integrated circuitry fabricated on the device side of logic chip 48. Some of that integrated circuitry is data decompression and expansion circuitry 64. As the wafer moves underneath the ionjet head assembly 23 in the X-direction 32, each of the 262,144 proton beams of each of the twelve ionjet heads may be controlled to irradiate a corresponding 5 nm diameter spot of photoresist. These 5 nm spots are written together at one time as one line. This line extends from one edge of the wafer to the other in the Y-direction 33. Each ionjet head, for one such line extending across the wafer in the Y-direction, receives 256 64-bit packets of compressed data via its cable. These 16,384 bits of compressed data are decompressed and expanded to 262,144 bits. Each of these 262,144 bits determines whether a corresponding one of the 262,144 5 nm diameter spots of photoresist will be exposed by this ionjet head. In each ionjet head, there is one gate driver for each acceleration channel. Each of the 262,144 acceleration channels 66 of an ionjet head emits a corresponding one of the 262,144 proton beams. The decompressed and expanded 262,144 bits from the data decompression and expansion circuitry 64 are supplied to the 262,144 gate drivers 65. After the gate drive bits are supplied to the gate drivers, a separate clocking signal is supplied by the X-position controller 20 that causes each of the 262,144 channels of the ionjet head to emit a proton beam or not. This constitutes one Y-axis line write.

Figure 12:
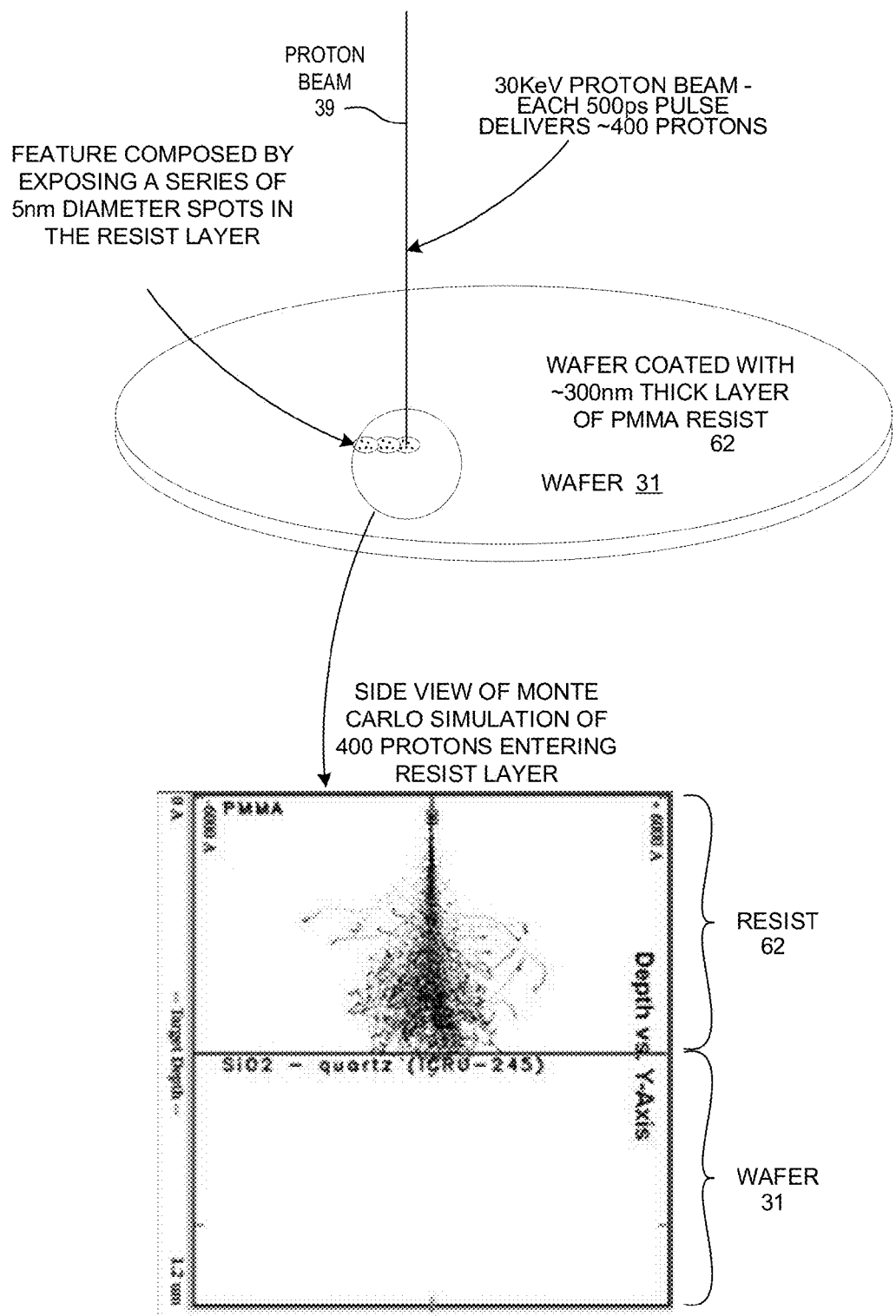
FIG. 12 is a more detailed diagram showing how a proton beam 39 of DWOW printing system 12 can expose a series of 5 nm diameter spots of photoresist.

FIG. 12 is a more detailed diagram showing proton beam 39 exposing a series of 5 nm diameter spots of photoresist 62. Each 5 nm spot, if it is to be exposed, receives one bunch of approximately 40 protons from one acceleration channel. The cross-sectional diagram at the bottom of FIG. 12 illustrates one bunch of 40 protons of an energy of 10 KeV entering layer 62 of photoresist. The decelerating protons cause collateral electrons to be produced, and these collateral electrons in turn expose the photoresist. These collateral electrons, however, have lower energies in the range of about 1 KeV. Due to the low energy of the collateral electrons, their lateral extent is limited. In the prior art of using an E-beam of 10 KeV, on the other hand, the 10 KeV electrons penetrate the photoresist and due to their larger energies move farther in the lateral dimension. Because of the lateral extent of the proton beam, collateral electrons are limited compared to the lateral extent of E-beam electrons, the proton beam of DWOW printing system 12 can expose a smaller spot size for a given beam energy as compared to an E-beam stepper.

Figure 13:
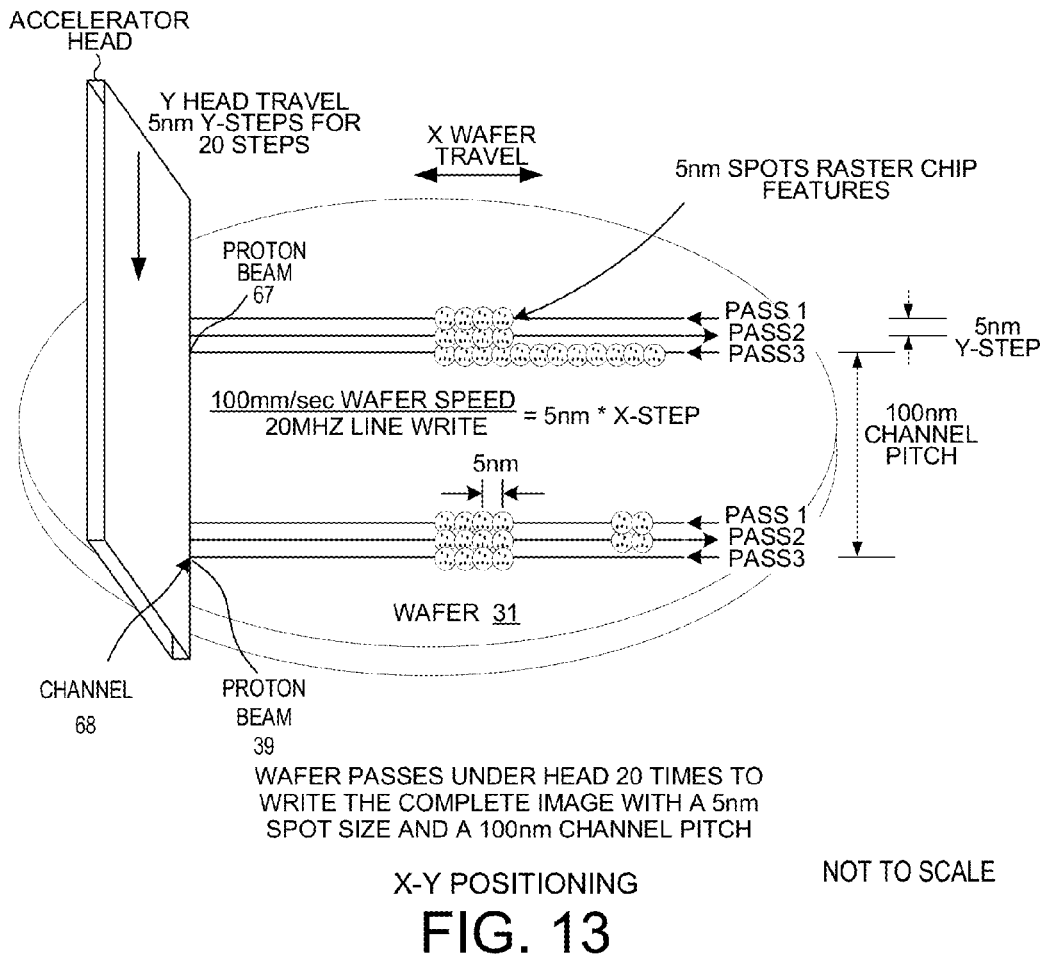
FIG. 13 is a perspective diagram that shows how the photoresist of a wafer is completely scanned in twenty passes even though the accelerator channels of the ionjet head assembly are on a 100 nm pitch.

FIG. 13 shows how the photoresist on the wafer 31 is completely scanned in twenty passes of the ionjet head assembly 23 even though the acceleration channels are on a 100 nm pitch. 100 nm pitch means that center line of adjacent acceleration channels are 100 nm apart. FIG. 13 is not to scale, but FIG. 13 shows two proton beams 39 and 67 output by two adjacent acceleration channels that are separated by 100 nm. The 100 nm separation on the wafer surface is covered in twenty passes as the ionjet head assembly is moved in 5 nm Y-steps on the Y-axis for each successive pass. Accordingly, after twenty passes of the ionjet head assembly over wafer 31, the entire surface of the photoresist on wafer 31 has been scanned, with each 5 nm spot of photoresist either being irradiated or not.

Figure 14:
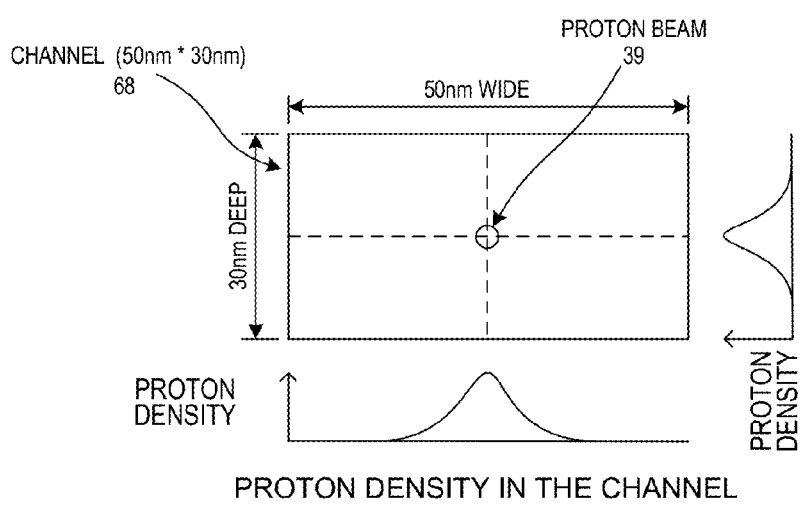
FIG. 14 is a diagram looking into the proton exit port of the acceleration channel from which proton beam 39 is emitted.

FIG. 14 is a view looking into the exit port end of the acceleration channel 68 from which proton beam 39 is emitted. Acceleration channel 68 has a rectangular cross section. Acceleration channel 68 is 30 nm deep and 50 nm wide. The channel walls are made of silicon dioxide dielectric material and include no metal surfaces. For improved electric field distribution, a high-k dielectric is preferred. The proton beam 39 is centered in the channel due to the repulsion of protons of the proton beam 39 from positive charges on the inside wall surfaces of the channel as provided by the dielectric. Spot size irradiated by a proton beam is adjustable by varying the distance between the top of wafer 31 and the channel exit port from which the proton beam is emitted. Spot size can also be adjusted by increasing or decreasing the number of protons that irradiate the spot. One way to accomplish this is to change the number of protons per bunch. Another way to accomplish this is to write multiple bunches into the same spot.

Figure 15:
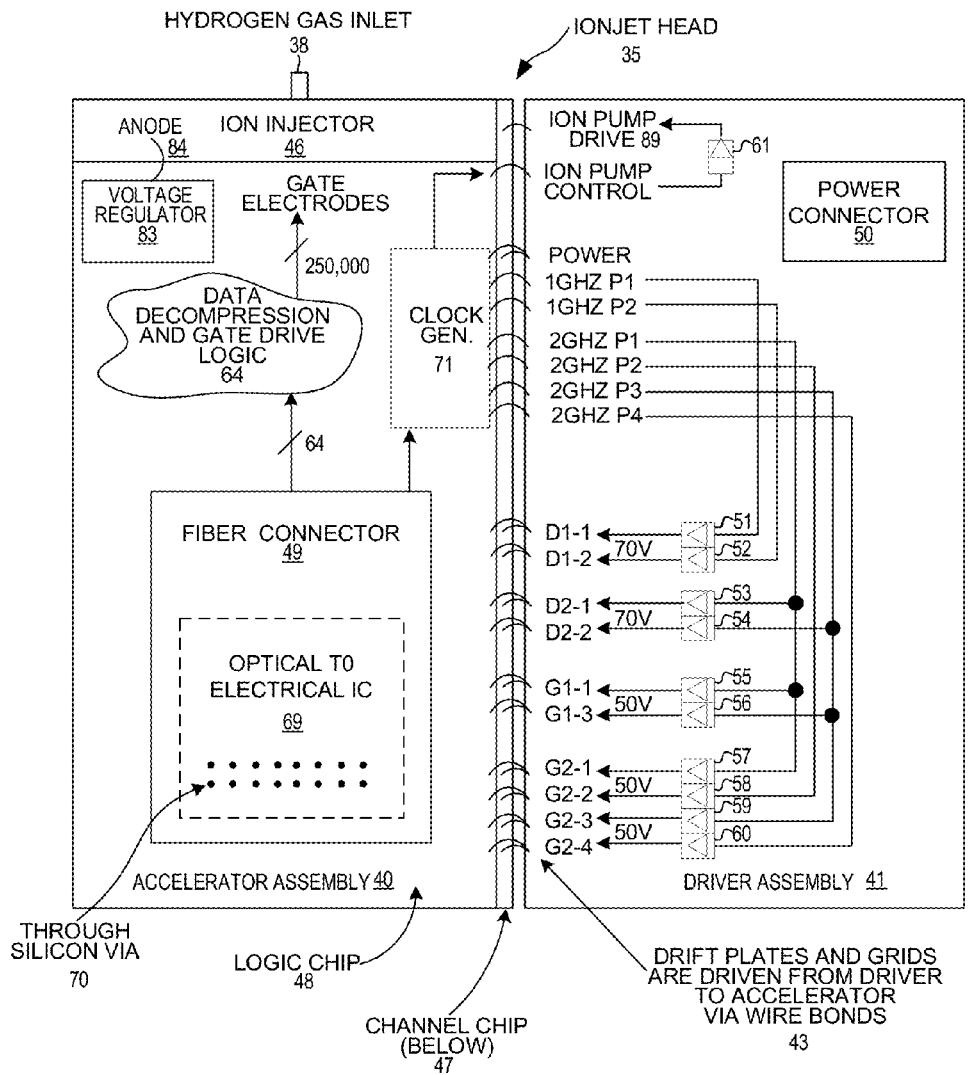
FIG. 15 is a diagram of the face of one ionjet head 35 of the ionjet head assembly 23 of the DWOW printing system 12 of FIG. 6.

FIG. 15 is a face view of ionjet head 35. An end of fiber data and optical cable 63 (which is a 72-fiber optical cable) extending from raster memory device 18 plugs into fiber optic connector 49. The optical signal passes into an optical-to-electrical integrated circuit 69 that is surface mounted onto the backside of logic chip 48. The optical-to-electrical integrated circuit 69 converts the optical signal into electrical signals. The electrical signals pass down into logic chip 48 through Through Silicon Vias (TSVs) to the data decompression and expansion circuitry 64 in the device layer of logic chip 48. Reference numeral 70 identifies one of these TSVs. Decompressed data passes to gate drivers and then on to the gate electrodes of the channels. In addition, several of the fibers provide clocking signals to clock generator 71. From the clocking signals, clock generator 71 generates clock signals 1 GHZ P1, 1 GHZ P2, 2 GHZ P1, 2 GHZ P2, 2 GHZ P3, 2 GHZ P4, and ION PUMP CONTROL. These clock signals pass from the accelerator assembly 40 to the driver assembly 41 across bond wires 43 as illustrated. High speed buffers 51-54 on the driver assembly 41 amplify the clocking signals to 70V amplitude to drive drift plates. High speed buffers 55-60 on the driver assembly 41 amplify the clocks signals to 50 volt amplitude to drive grid electrodes. High speed buffer 61 on the driver assembly 41 amplifies ION PUMP CONTROL signal to supply the ion pump drive signal 89 to the ion injector 46. A voltage regulator 83 on the accelerator assembly 40 supplies a negative DC voltage signal ANODE to porous catalytic anode 84 within ion injector 46. All power for logic circuitry and a −500 VDC supply voltage to drive the high voltage plates originates from power supply 86 (see FIG. 6) and is received onto driver assembly 41 via power connector 50.

Figure 16:
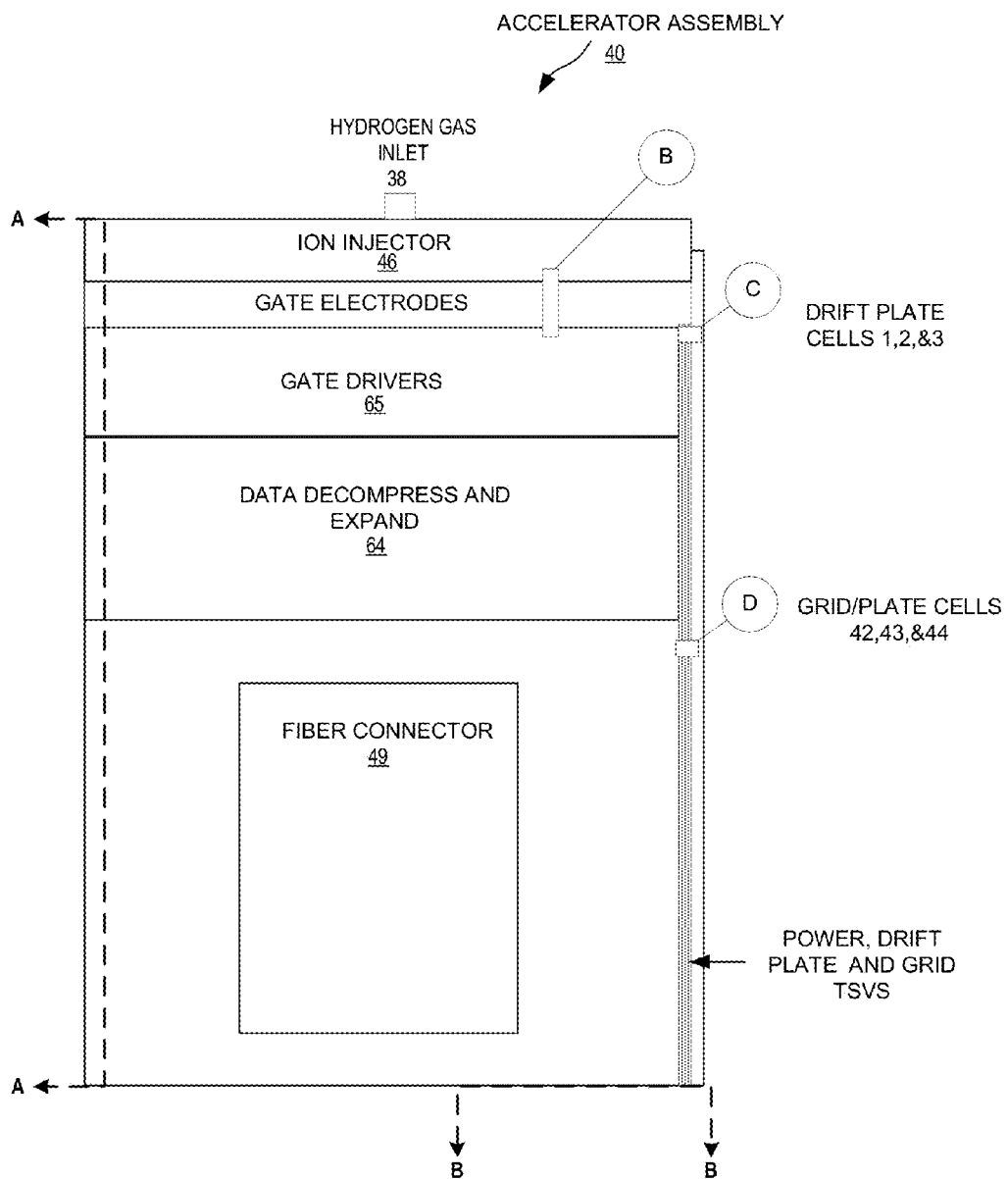
FIG. 16 is a diagram that shows where detail views and cross-sectional views in subsequent figures are taken in the ionjet head 35 of FIG. 16.

FIG. 16 is a diagram that shows where detail views and cross-sectional views in subsequent figures are taken in the ionjet head 35 of FIG. 16.

Figure 17:
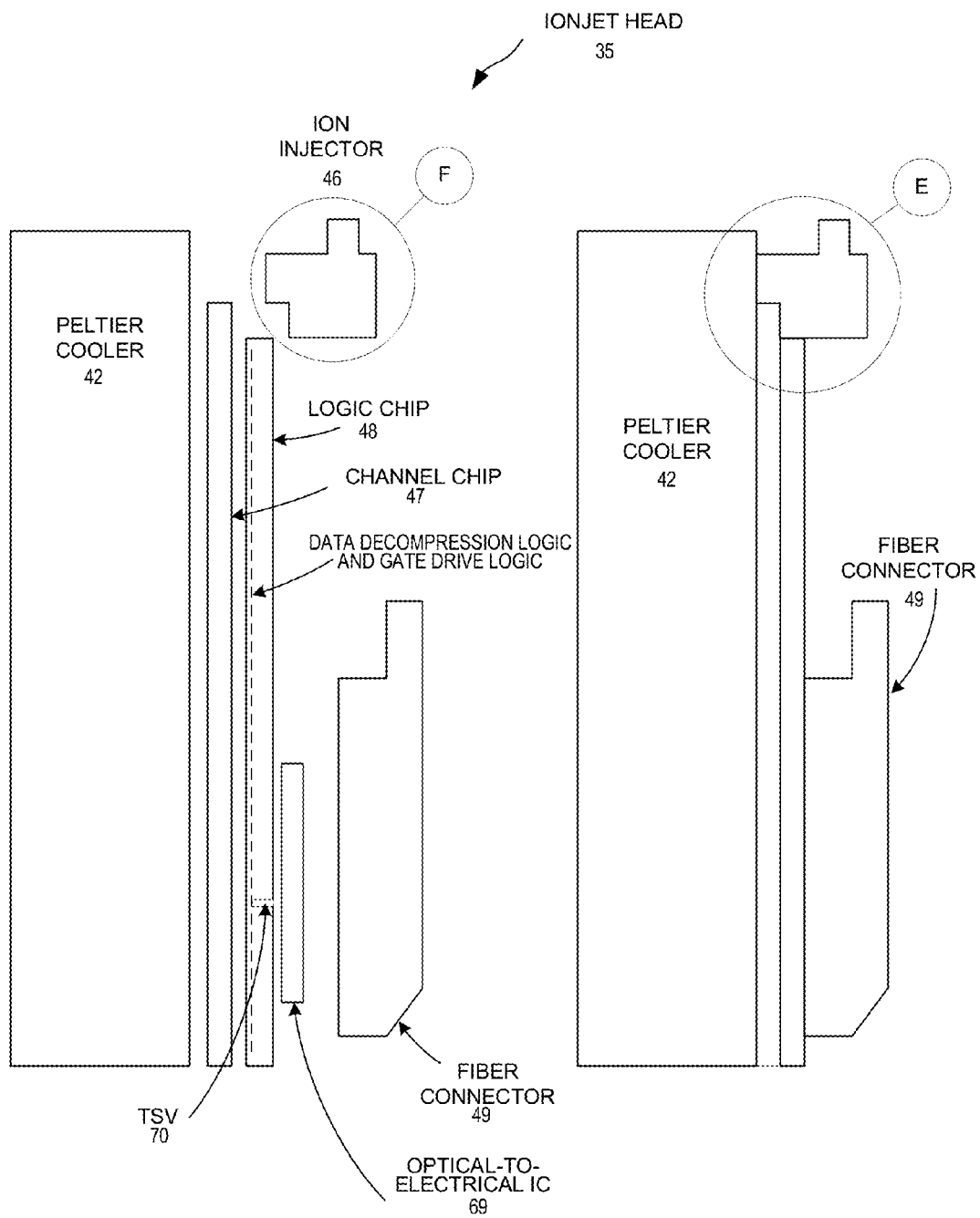
FIG. 17 is a cross-sectional diagram showing an exploded view (left side) and an assembled view (right side) of the ionjet head 35.

FIG. 17 is a cross-sectional diagram showing an exploded view (left side) and an assembled view (right side) of the ionjet head 35.

Figure 18:
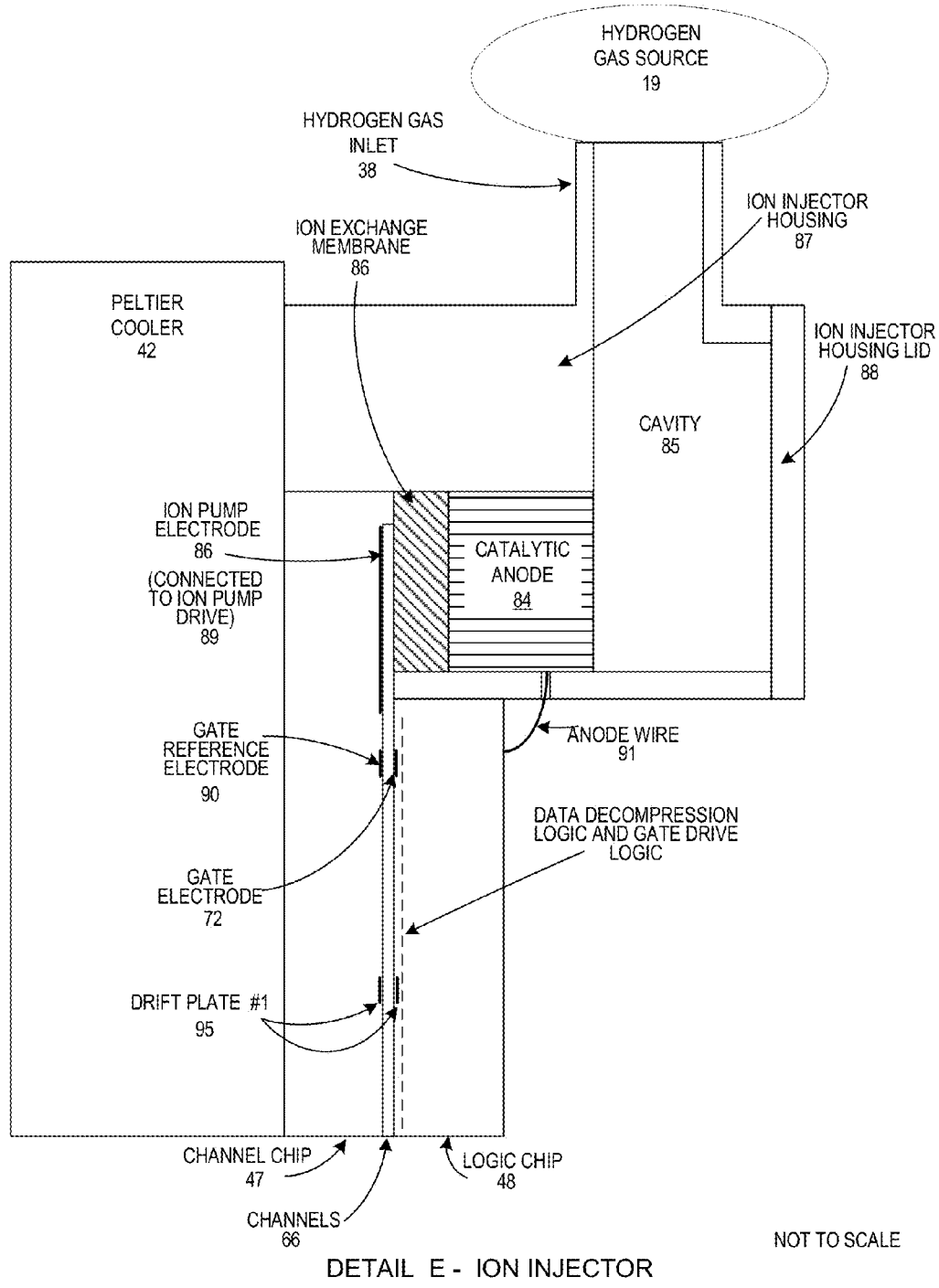
FIG. 18 is a cross-sectional diagram of the ion injector end of ionjet head 35.

FIG. 18 is a cross-sectional diagram of the ion injector end of ionjet head 35. Low pressure hydrogen gas (typically 500 torr) from hydrogen gas source 19 passes through flexible tubing (not shown), through hydrogen gas inlet 38, and into a cavity 85 within ion injector 46. The entire DWOW printing system 12 is disposed in a vacuum chamber (not shown) at a pressure of approximately 50 torr. Pressure in the channels 66 is about 100 torr.

The hydrogen gas in cavity 85 is in contact with catalytic anode 84. Anode 84 forms an inside surface of cavity 85 between cavity 85 and the channels 66 as illustrated. In one example, catalytic anode 84 is a block of porous platinum (typically, 0.1 mm×0.1 mm×25 mm). An ion exchange membrane layer 86 is disposed in contact with anode 84. In one example, ion exchange membrane layer 86 is a layer of polybenzimidazole (PBI) ten microns thick. The anode/ion exchange assembly 84/86 is made by polishing the block of platinum until it is flat. The polished block is then cleaned to remove any debris. One side of the block is coated with a thin layer of PBI dissolved in a solvent. The PBI wicks into the pores in the platinum. The PBI solution is then allowed to dry in a vacuum to remove the solvent. The resulting anode/ion exchange assembly 84/86 is then inserted into a receiving slot in ion injector housing 87. Ion injector housing 87 is a ceramic structure. After insertion of the anode/ion exchange assembly, a housing lid 88 is attached to the housing 87 in a gas tight manner. The ion injector assembly, including the platinum 84 and ion exchange membrane layer 86, is then attached to the top of channel chip 47 as illustrated. The ion injector 46 is glued in a gas-tight manner to the Peltier cooler 42 so that ion injector 46 is in contact with the channel chip as illustrated. The ion exchange membrane within the ion injector, however, is not molecularly bonded to channel chip 47. Consequently, there is a small gap between the ion exchange membrane layer 86 and the top of the channel chip 47.

When a hydrogen gas molecule in cavity 85 comes into contact with anode 84, the hydrogen molecule is disassociated into hydrogen atoms that are stripped of their electrons. The resulting protons are then selectively passed through the ion exchange membrane 86. Ion exchange member 86 blocks hydrogen gas flow. Protons exiting the ion exchange membrane 86 are attracted to a −15 volt potential on an ion pump electrode 89. There is one such ion pump electrode 89 for the entire ionjet head 35. The −15 volt potential is clocked to draw protons into the ends of the acceleration channels. A short distance (about 100 microns) down the acceleration channel, and located below the acceleration channel, is a gate reference electrode 90. This gate reference electrode 90 is at ground potential. Directly above the gate reference electrode 90 above the acceleration channel is a gate electrode 72. If the voltage on the gate electrode 72 is positive (for example, >1 volt), then protons at the end of the channel will not move from the end of the channel. If the positive voltage on gate electrode 72 is removed, then protons at the end of a channel will be accelerated through the channel toward drift plate #1 95. The voltage on the gate electrode of each acceleration channel is controlled individually to determine whether protons pass down the acceleration channel or not.

Figure 19:
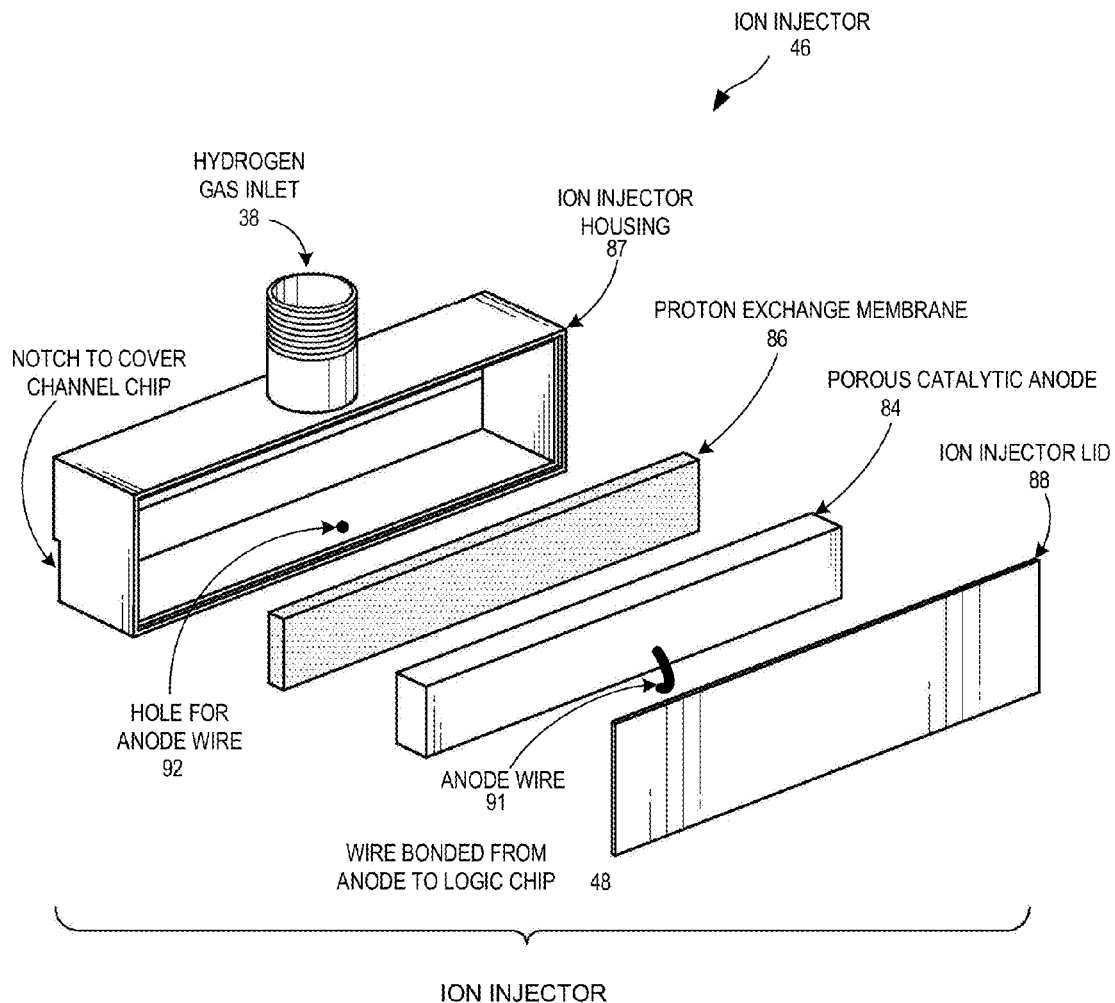
FIG. 19 is an exploded perspective view of the ion injector 46 of ionjet head 35.

FIG. 19 is an exploded perspective view of ion injector 46. Hole 92 is provided in housing 87 so that wire 91 can connect anode 84 to logic chip 48.

Figure 20:
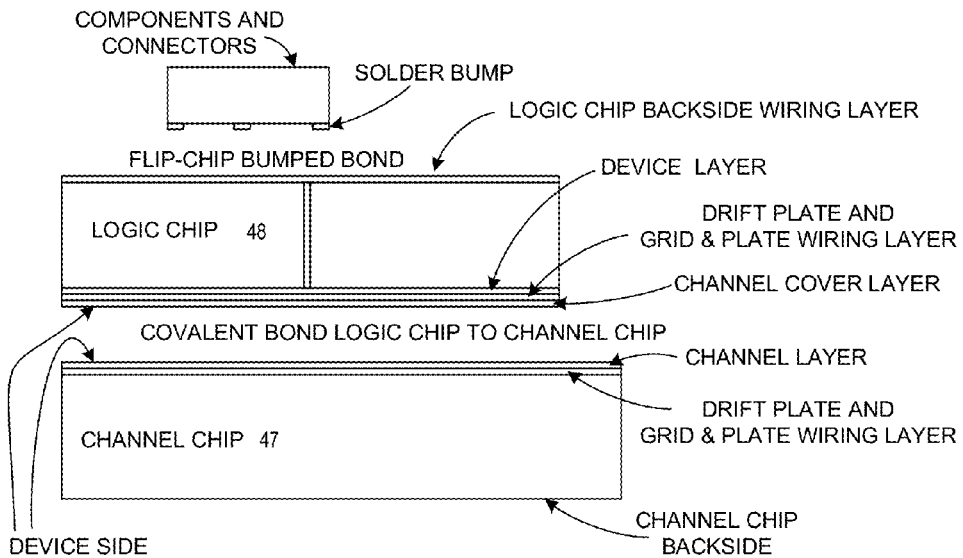
FIG. 20 is a cross-sectional exploded view showing the manner by which the parts of ionjet head 35 are bonded together.

FIG. 20 is a cross-sectional exploded view showing the manner by which the parts of ionjet head 35 are bonded together. Components and connectors on the backside of logic chip 48 are flip-chip bump bonded to the backside of logic chip 48. Logic chip 48 and channel chip 47 are covalently bonded to insure homogeneous channel surfaces at the atomic level.

Figure 21:
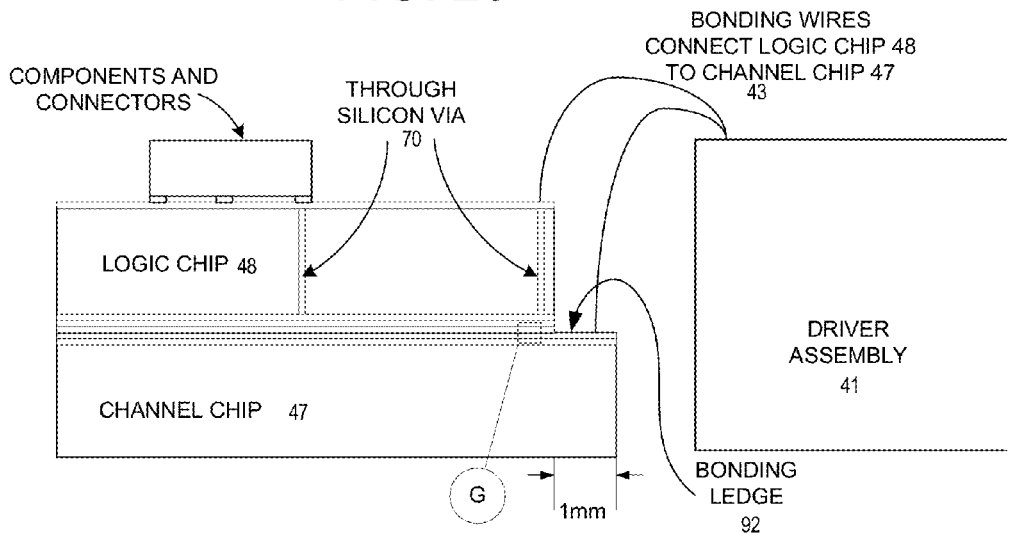
FIG. 21 is a cross-sectional view showing how electrical signals pass between the accelerator assembly 40 and the driver assembly 41 across bond wires 43.

FIG. 21 is a cross-sectional view showing how electrical signals pass between the accelerator assembly 40 and the driver assembly 41 across bond wires 43. Driver devices 51-61 drive conductors located both on the channel chip 47 and on the logic chip 48. For example, a clock signal originating from logic chip 48 passes from a bond pad on the backside of logic chip 48, across a bond wire, and to driver assembly 41. The clock signal passes through a driver device of the driver assembly. The driver device then drives the higher voltage clock signal back across a first bond wire to channel chip 47 bonding ledge 92 and also drives the higher voltage clock signal back across a second bond wire to logic chip 48. An electrical connection that needs to be made between the channel chip and the logic chip (not shown) can be provided by a direct bond wire extending from a pad on bonding ledge 92 up the a bond pad on the backside of logic chip 48. On logic chip 48, connection between a bonding pad and the device layer is accomplished using TSVs such as TSVs 70.

Figure 22:
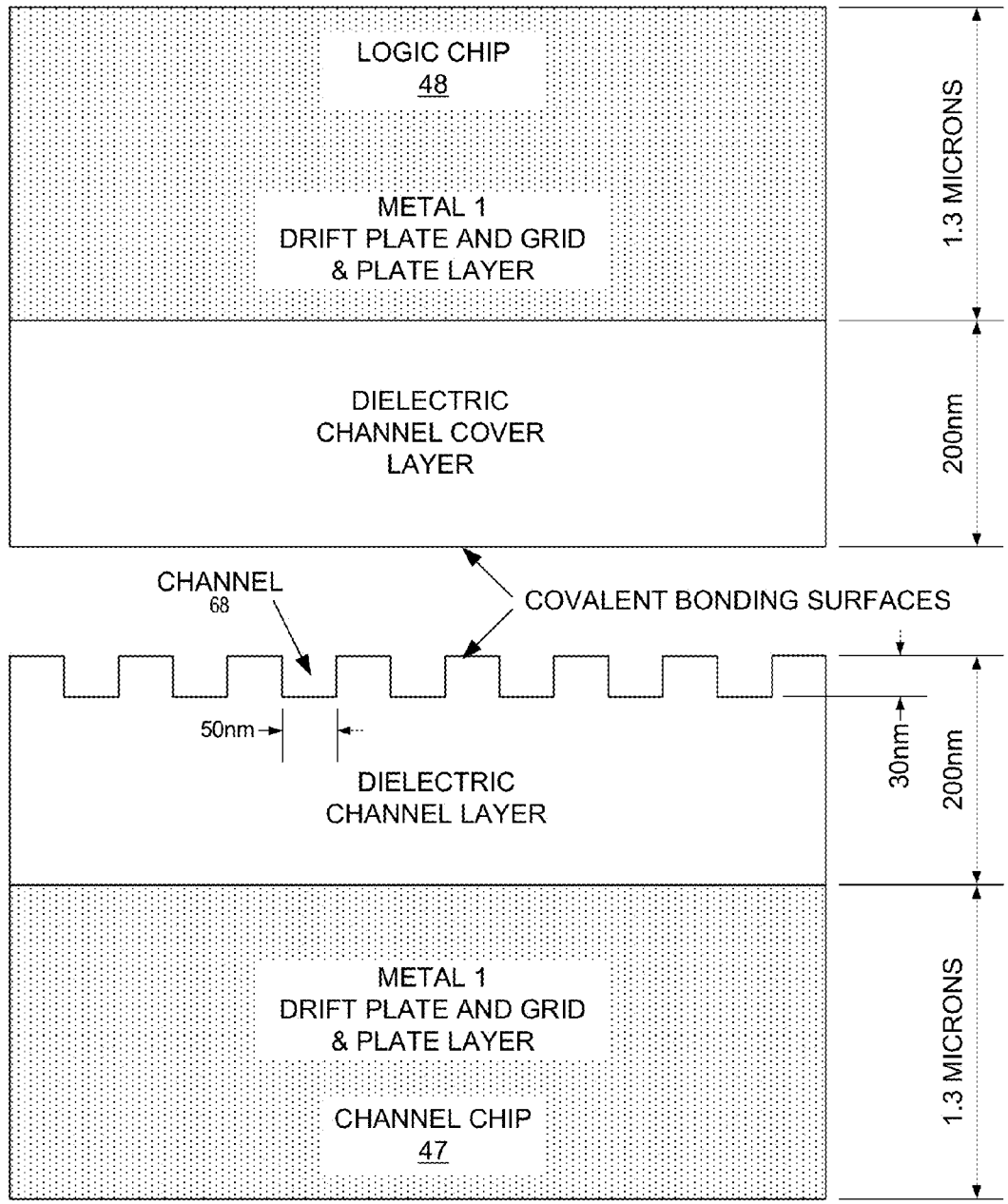
FIG. 22 is an exploded view of the acceleratory assembly 40, looking into the exit ports of some of the channels 66.

FIG. 22 is an exploded view looking into the exit port of some of the channels 66. To form the channels, silicon dioxide or other dielectric on the front side of channel chip 47 is CMP polished to be flat. After CMP polishing, an etching step is performed to form the channels into the silicon dioxide layer. Each channel is 50 nm wide and 30 nm deep. The silicon dioxide cover layer of the device side of the logic chip 48 is also CMP polished flat. The two silicon dioxide layers (of the channel chip 47 and the logic chip 48) are then aligned and covalently (fusion) bonded.

Although this fusion bonding is a bonding of chips, in other embodiments a wafer of channel chips is fusion bonded to a wafer of logic chips, and after the fusion bonding the bonded wafer structure is sectioned to form many channel chip/logic chip assemblies.

Figure 23:
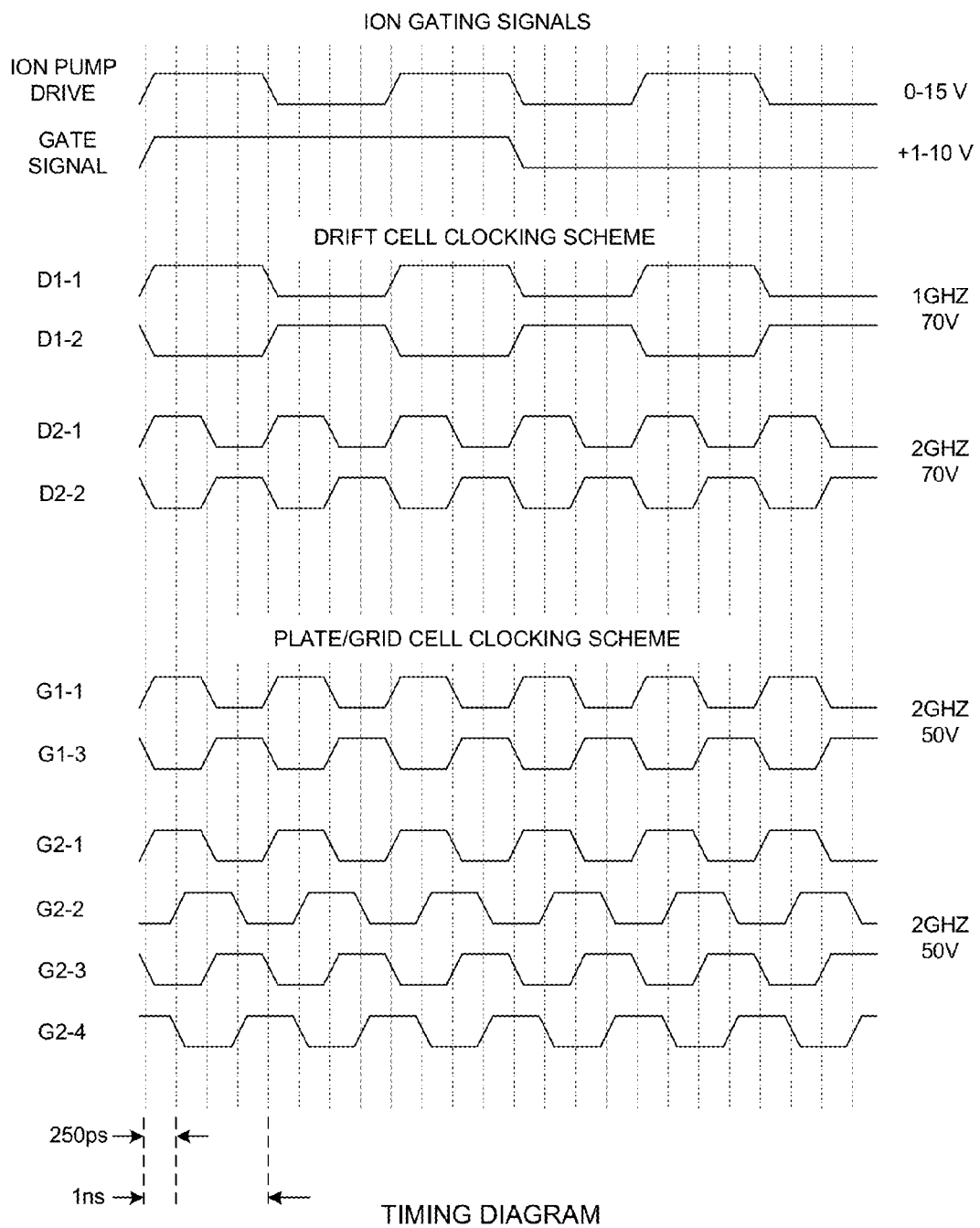
FIG. 23 is a timing diagram that illustrates operation of ion gating, drift cells, and plate/grid cells.

FIG. 23 is a timing diagram that illustrates operation of ion gating, drift cells, and plate/grid cells. Each acceleration channel, extending in a direction away from the ion injector, passes in a straight line through an ion gate, multiple drift cells, and multiple plate/grid cells.

Figure 24B:
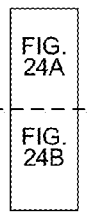

FIG. 24 is a table that shows, for each accelerator cell, the kinetic energy and velocity of the proton bunch as it exits the accelerator cell. Each accelerator cell includes an acceleration region and a drift region. The speed of the protons increases in each accelerator cell as the protons pass through the acceleration region of the cell. The amount of acceleration is proportional to the voltage difference across the gap (acceleration region) of the cell as provided by the clock signals. Because a fixed frequency is applied to the drift plates, each successive accelerator cell must be longer than the previous accelerator cell. Various techniques such as increasing the clock frequency and introducing multiple phases are used to reduce the length of accelerator cells. For example, the length of the first cell is indicated by the value in the second rightmost column of the second row of the table of FIG. 24 to be 92.7 microns. The frequency of the clock signal D1-1 that drives the drift plate of the first cell is 1 GHz. By the tenth cell, the length of the cell is 293.2 microns as indicated by the value in the second rightmost column of the eleventh row of the table. The frequency of the clock signal D1-2 that drives the drift plate of the tenth cell is 1 GHz. The frequency of the clock signal D1-1 that drives the drift plate of the elevenths cell is 2 GHz. By doubling the frequency that drives the drift plate, the eleventh cell is only 153.8 microns long (as opposed to approximately 307.6 microns). The clock signals D1-1, D1-2, D2-1, D2-2, G1-1, G1-2, G1-3, and G1-4 that are shown in the table of FIG. 24 are the same signals that are shown in FIG. 15 being driven by the driver devices 51-60 from the driver assembly 41 to the accelerator assembly 40. In the example of FIG. 24, the lengths of the accelerator cells were determined assuming a certain amount of acceleration per cell. The certain amount of acceleration per cell was previously determined based on the mass of a proton, and considering the changing forces on the proton due to the grid electrode and plate voltages throughout the period of travel of the proton through the accelerator cell. Once the ionjet head has been made and the lengths of its accelerator cells have been fixed to the lengths set forth in FIG. 24, then the voltage levels of the clocking signals that drive the grid electrodes and the voltage level of the high voltage plate voltage can be modified to adjust the acceleration per cell so that protons traveling in the channel will be the correct place within the each cell at the correct time considering the phase and amplitude of the driving clock signals employed. Alternatively, the frequency of the driving clock signals can be adjusted. In one example, an iterative process of making an ionjet head and then testing it is employed to determine the accelerator cell lengths, the voltage levels of the driving clock signals, the voltage on the high voltage plate, and the frequency and wave shapes of the driving clock signals.

Figure 25:
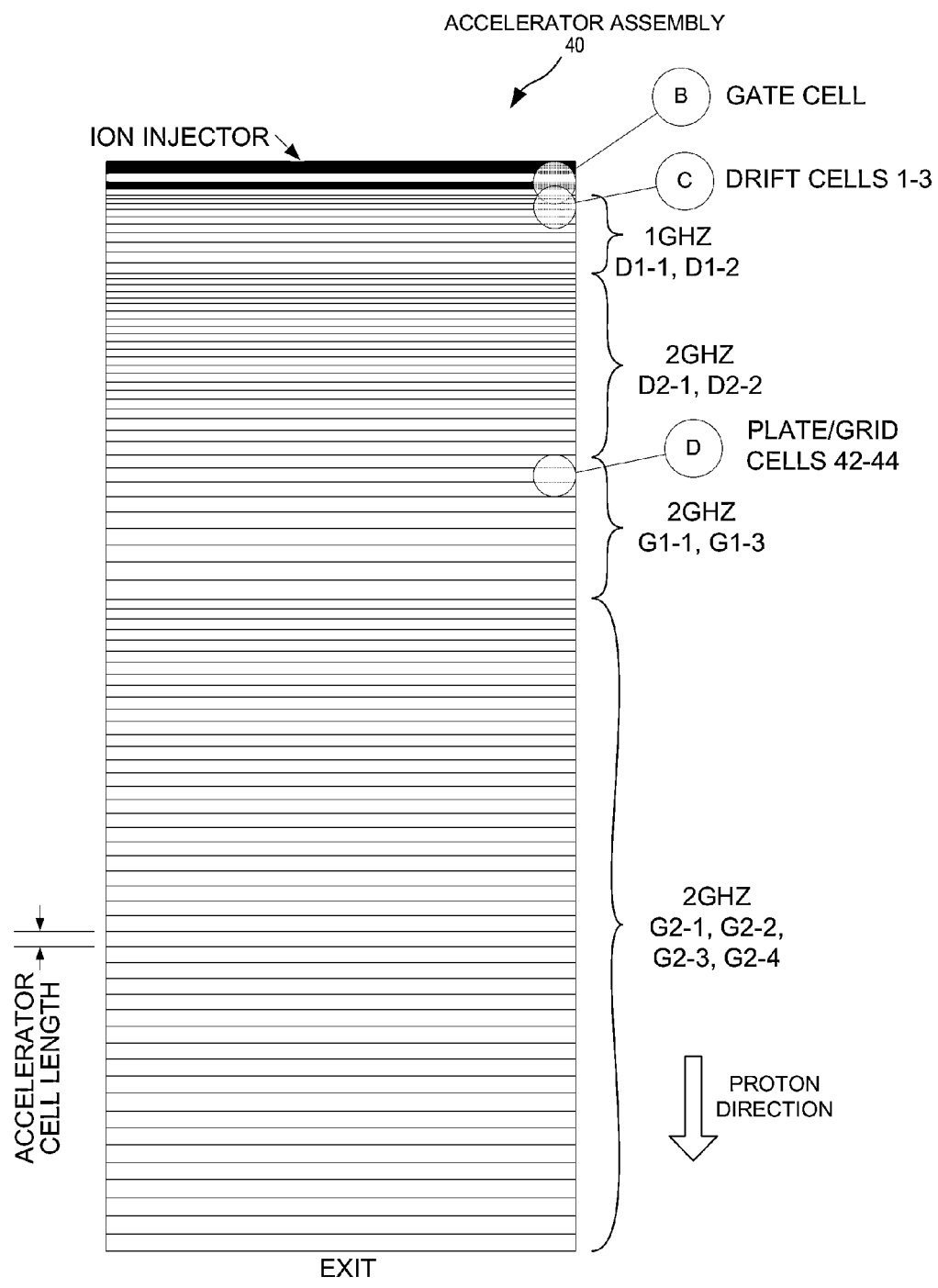
FIG. 25 is a diagram that illustrates how the lengths of the accelerator cells increase in the direction of proton travel and clock frequency and clocking scheme are changed.

FIG. 25 illustrates how the length of the cells increases in the direction of proton movement down the acceleration channels.

Figure 26:
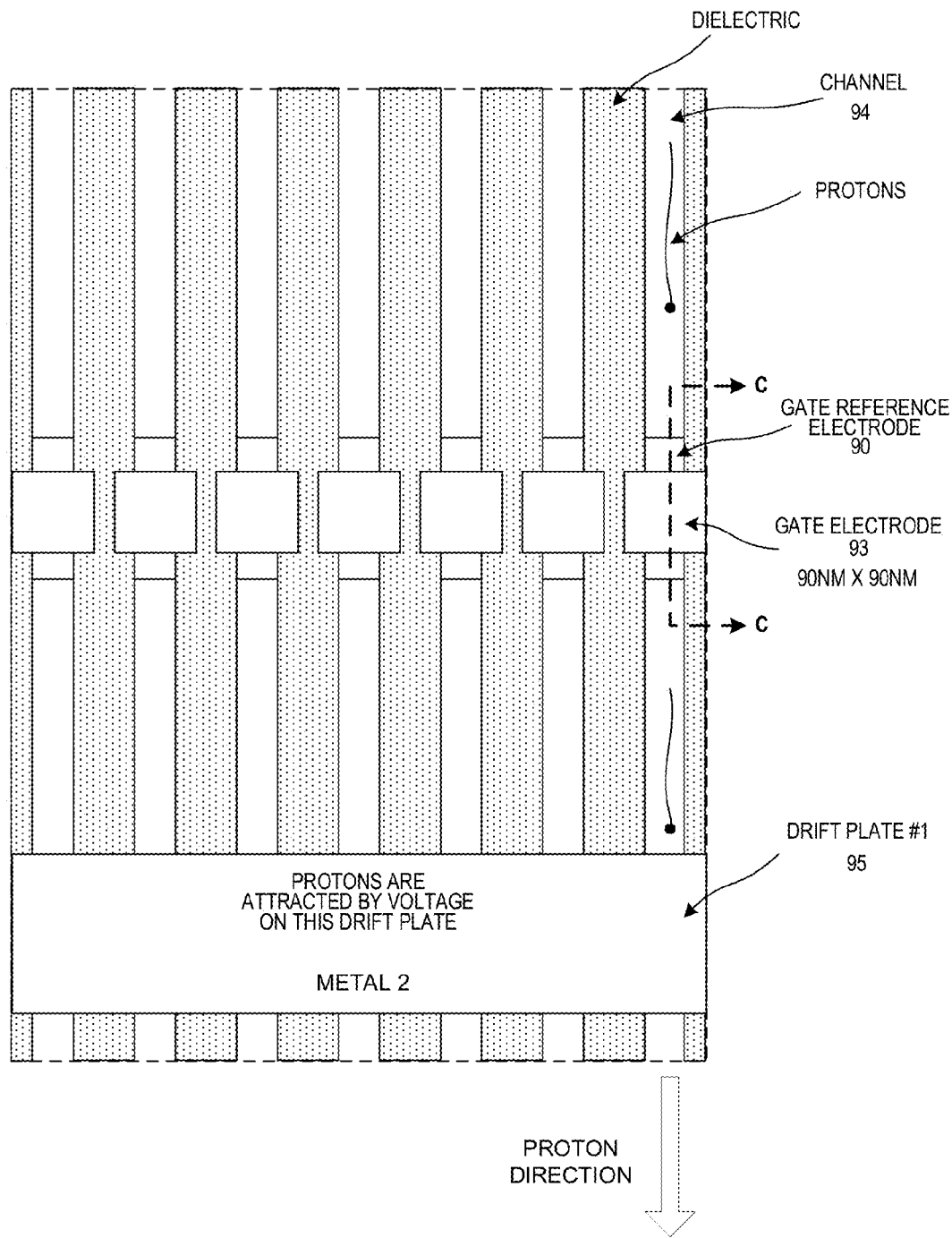
FIG. 26 is a detail of a part of the accelerator assembly of FIG. 25 indicated with the circle labeled "B" in FIG. 25.

FIG. 26 is a detail of a part of the accelerator assembly of FIG. 25 indicated with the circle labeled "B" in FIG. 25. There is one gate cell for every acceleration channel. In the diagram, seven gate cells are shown in top-down perspective. Proton flow proceeds from the top of the diagram to the bottom of the diagram. The row of small squares is a row of gate electrodes, one of which is labeled with reference numeral 93. Each gate electrode is 90 nm by 90 nm square from the top-down perspective of the diagram. Underneath the gate electrodes, is the horizontally extending gate reference electrode 90. Acceleration channel 94 extends between the gate reference electrode 90 and the gate electrode 93. Reference numeral 95 identifies drift plate #1. Protons from the ion injector and the section of the acceleration channel under the ion injector are attracted by the voltage on drift plate #1 supplied by signal D1-1. This flow of protons is gated by the gate signal on gate electrode 93.

Figure 27:
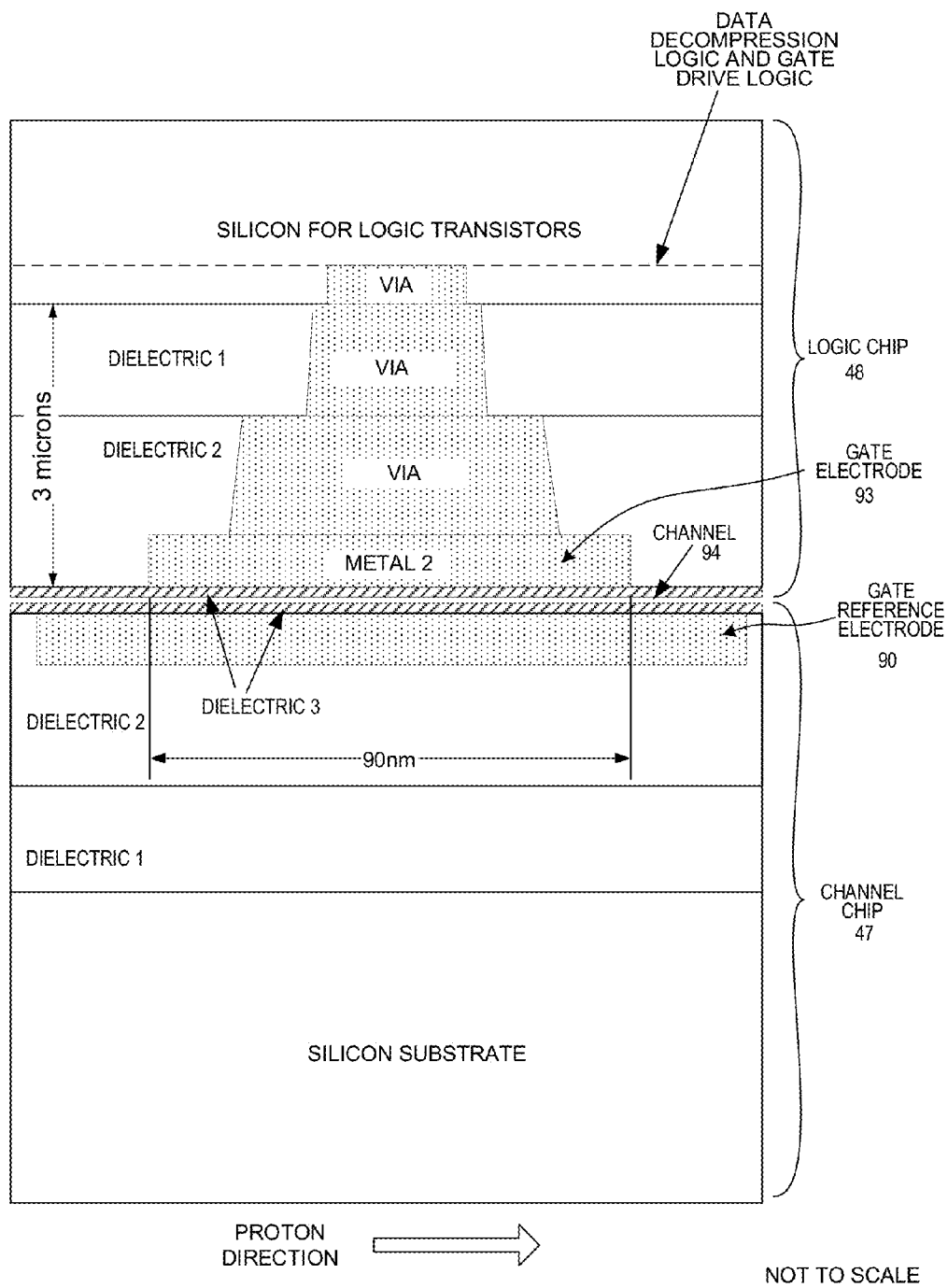
FIG. 27 is a cross-sectional diagram taken along line C-C of FIG. 26.

FIG. 27 is a cross-sectional view taken along line C-C of FIG. 26. Gate electrode 93 of FIG. 26 is one of the 262,144 gate electrodes identified on FIG. 15. Each gate electrode is connected to a corresponding one of the gate drivers 65 via a stack of conductive metal vias. The gate drivers are located on the device side of the semiconductor substrate portion of logic chip 48.

Figure 28:
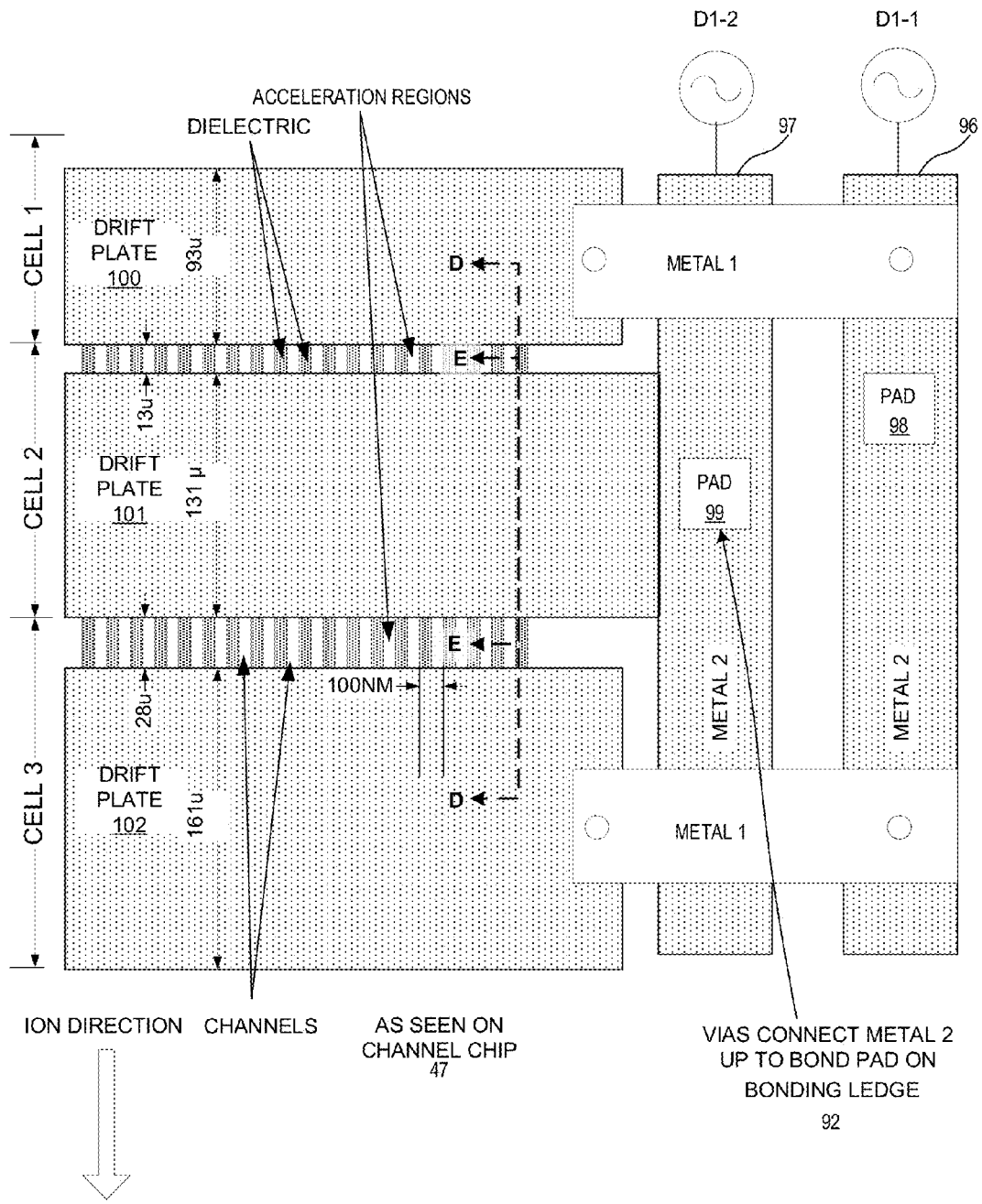
FIG. 28 is a detail of a part of the channel chip indicated with the circle labeled "C" in FIG. 26.

FIG. 28 is a detail of a part of the accelerator assembly 40 of FIG. 25 indicated with the circle labeled "C" in FIG. 25. The diagram is a top-down diagram of the layout of three drift cells: cell 1, cell 2 and cell 3. Extending vertically down the right edge of bonding ledge 92 of the channel chip is D1-1 conductor 96 and D1-2 conductor 97. D1-1 conductor 96 supplies the D1-1 signal to the drift plates of every other drift cell, including drift plate 100 of cell 1 and drift plate 102 of cell 3. D1-2 conductor 97 supplies the D1-2 signal to the drift plates of every other drift cell, including drift plate 101 of cell 2. Driver device 51 of the driver assembly outputs the D1-1 signal that is communicated across a coaxial bond wire to pad 98. The D1-1 signal is then communicated from pad 98 down through vias to D1-1 conductor 96. Driver device 52 of the driver assembly outputs the D1-2 signal that is communicated across a coaxial bond wire to pad 99. The D1-2 signal is then communicated from pad 99 down through vias to D1-2 conductor 97. The drift plates extend parallel to one another laterally from the bonding ledge 92 on the right edge of the accelerator assembly 40 all the way across the accelerator assembly 40 to the left edge of the accelerator assembly 40.

FIG. 28 shows a detail of the channel chip. In the logic chip there is a corresponding set of vertically extending conductors for the D1-1 and D1-2 signals. There is also a corresponding set of laterally extending drift plates. TSVs couple the vertically extending D1-1 and D1-2 conductors of the logic chip up to bond pads located on the backside of the logic chip. Bond wires then connect corresponding ones of the vertically extending conductors of the logic chip to vertically extending conductors of the channel chip by coupling bond pads on the backside of the logic chip to bond pads on the bonding ledge of the channel chip.

Figure 29:
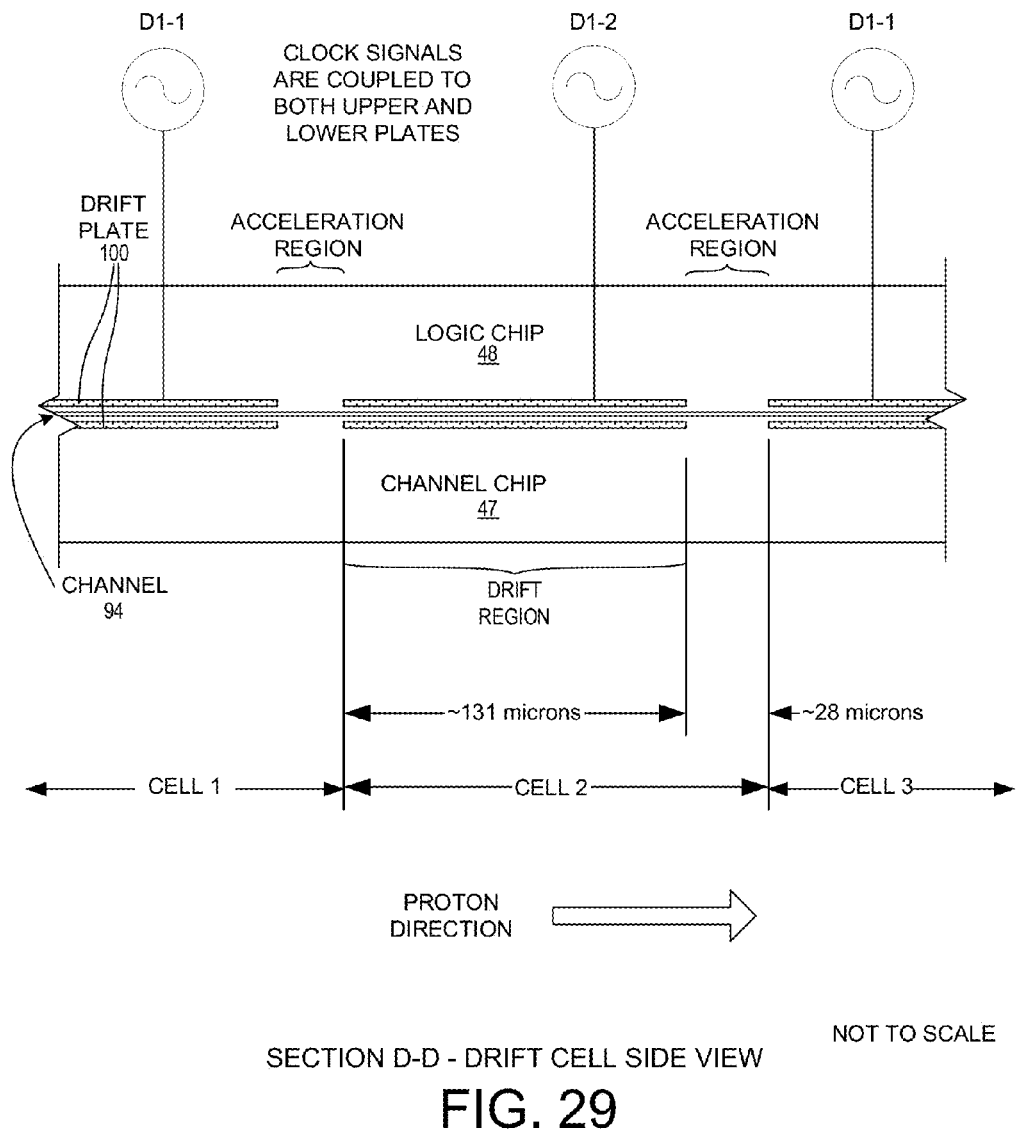
FIG. 29 is a simplified cross-sectional side view of three drift cells of FIG. 28 taken along line D-D of FIG. 28.

FIG. 29 is a cross-sectional side view that shows the three drift cells of FIG. 28 taken along line D-D of FIG. 28. Gate electrode 93 of FIG. 26 is one of the 262,144 gate electrodes identified on FIG. 15. Each such connection between a gate electrode and a corresponding one of the gate drivers 65 is made with stack of conductive metal vias. The drift plates are copper conductors that are approximately one micron thick. The copper is covered by a layer of silicon dioxide approximately 0.1 thick.

Figure 30:
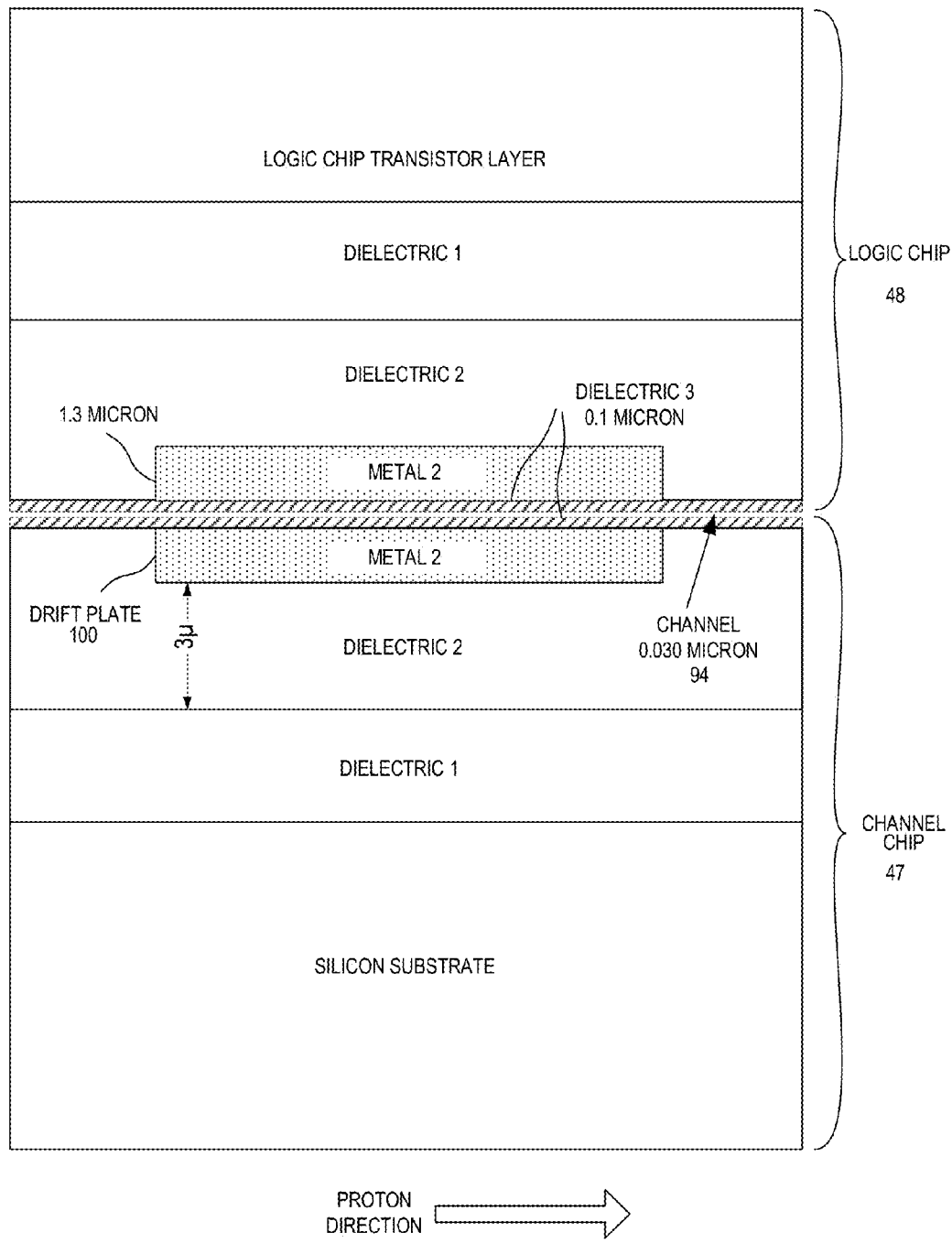
FIG. 30 is a cross-sectional view taken along line E-E of FIG. 28.

FIG. 30 is a cross-sectional view taken along line E-E of FIG. 28.

Figure 31:
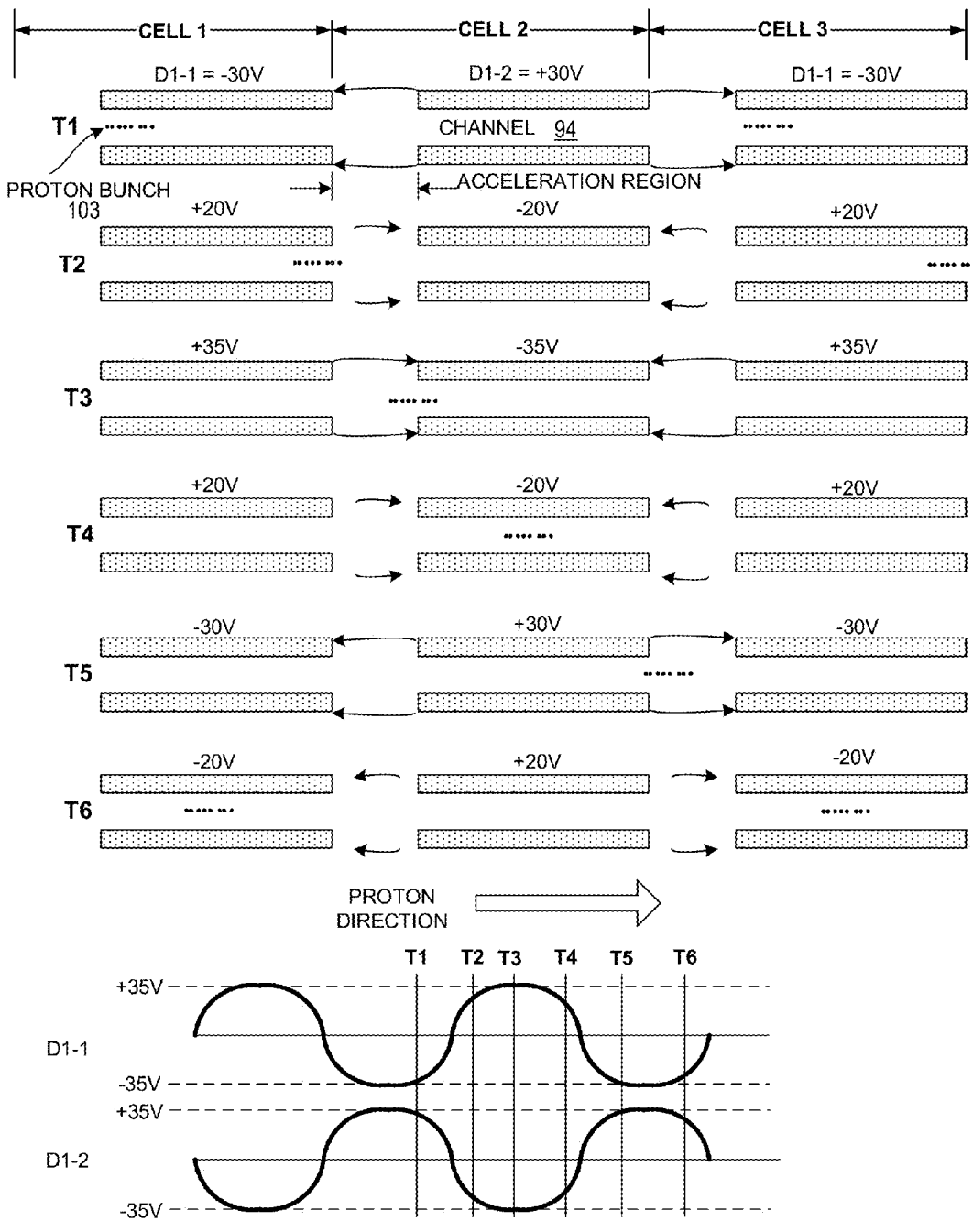
FIG. 31 is a diagram that shows proton bunch 103 traveling down channel 94 of FIG. 29 at a sequence of times T1 through T6.

FIG. 31 is a diagram that shows a proton bunch 103 traveling down channel 94 at a sequence of times T1 through T6. The upper diagram shows the position of proton bunch 103 at time T1. At time T1, proton bunch 103 is entering the drift region of cell 1. The magnitude of signal D1-1 is –30 volts at time T1 as indicated by the sinusoidal signal waveform diagram at the bottom of FIG. 31, so the voltage on drift plate 101 at time T1 is –30 volts. Proton bunch 103, when it is in the drift region, is not accelerating but rather is said to be "drifting". At time T2, as indicated by the next lower diagram, proton bunch 103 is exiting the drift region of cell 1. The lead protons see a 40 volt acceleration potential due to the difference between the +20 volts on the drift plate of cell 1 and the –20 volts on the drift plate of cell 2. At time T3, proton bunch 103 is entering the drift region of cell 2, and the trailing protons see the full 70 volt acceleration potential. Because the lead protons of the bunch do not experience the full acceleration potential, but are traveling faster, and because the trailing protons which are traveling slower see the full acceleration potential, the proton bunch is compressed and remains a "bunch". Despite this compression, the protons of the bunch are nonetheless aligned coaxially along the center axis of channel 94. At time T4, proton bunch 103 is drifting in the drift region of cell 2. At time T5, the proton bunch is in the acceleration region between cell 2 and cell 3, and is seeing a 60 volt acceleration potential. At time T6, the proton bunch 103 is drifting in the drift region of cell 3.

Figure 32:
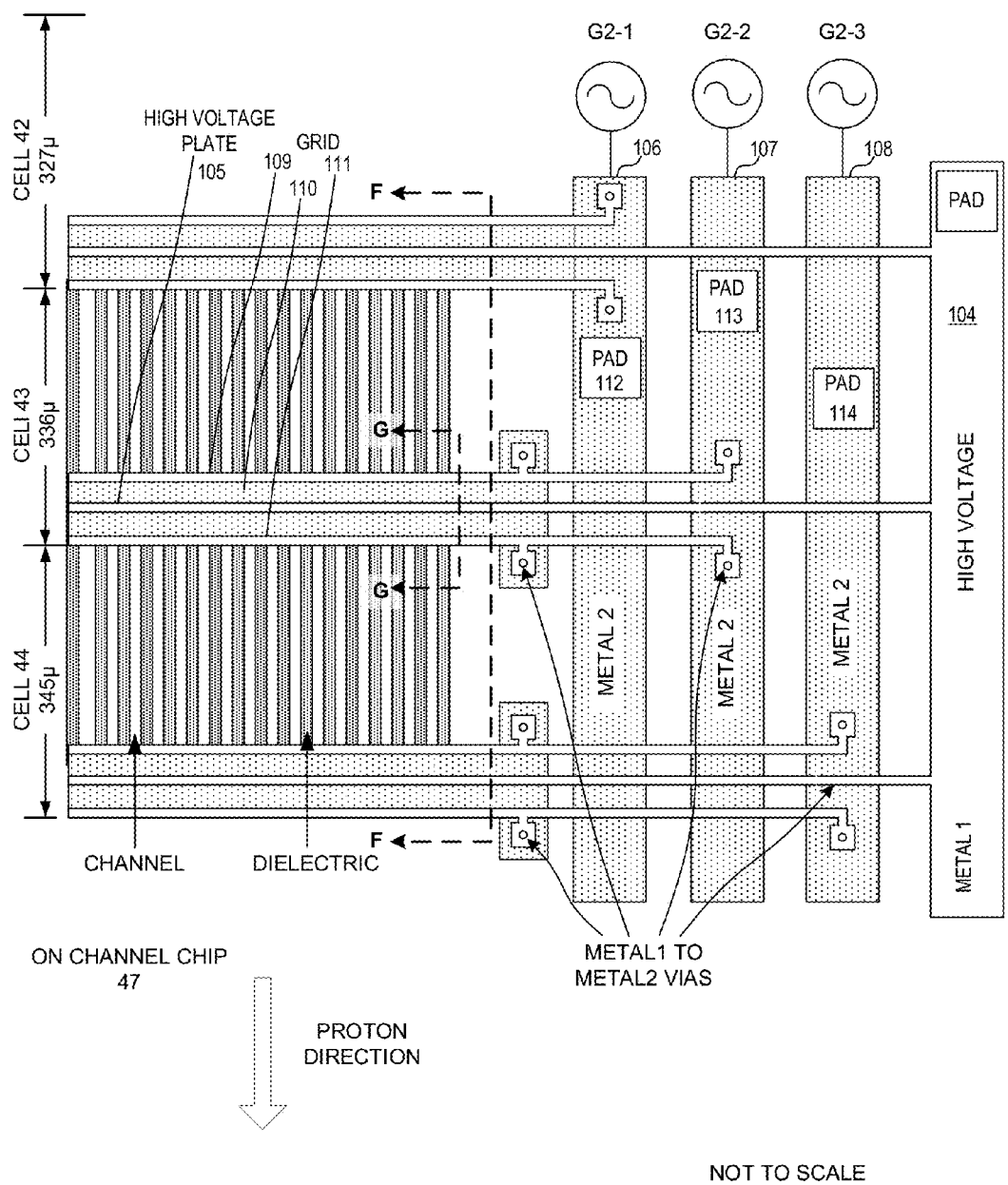
FIG. 32 is a detail of a part of the accelerator assembly 40 of FIG. 25 indicated with the circle labeled "D" in FIG. 25.

FIG. 32 is a detail of a part of the accelerator assembly 40 of FIG. 25 indicated with the circle labeled "D" in FIG. 25. The diagram is a top-down view of the layout of three plate/grid accelerator cells: cell 42, cell 43 and cell 44. In this acceleration scheme, a static –500 volt DC high voltage is applied to a high voltage plate of each accelerator cell. A vertically extending conductor 104 supplies this –500 VDC high voltage to each of a plurality of laterally extending high voltage plates. There is one such vertically extending conductor on the channel chip and it runs down bonding ledge 92. Reference numeral 105 identifies the high voltage plate of plate/grid cell 43 in the channel chip. The high voltage plates extend laterally and in parallel across the entire accelerator assembly. Also extending vertically down the right edge of bonding ledge 92 of the channel chip are four conductors: G2-1 conductor 106, G2-2 conductor 107, G2-3 conductor 108, and G2-4 conductor (not shown). G2-1 conductor 106 supplies the G2-1 signal to the grid electrode of every fourth plate/grid cell, including the grid electrode of cell 42. G2-2 conductor 107 supplies the G2-2 signal to the grid electrode of every fourth plate/grid cell, including grid electrode 109-111 of cell 43. G2-3 conductor 108 supplies the G2-3 signal to the grid electrode of every fourth plate/grid cell, including the grid electrode of cell 44. The fourth vertically extending conductor that carries the G2-4 signal is disposed to the right of the G2-3 conductor and is out of the view of the illustration.

FIG. 32 shows a detail of the channel chip. In the logic chip there is a corresponding set of vertically extending conductors: one conductor for the –500 VDC high voltage, one conductor for the G2-1 signal, one conductor for the G2-2 signal, one conductor for the G2-3 signal, and one conductor for the G2-4 signal. TSVs couple these vertically extending conductors up to bond pads on the backside of the logic chip. Bond wires then connect corresponding ones of the vertically extending conductors of the logic chip to vertically extending conductors of the channel chip. These bond wires couple bond pads on the backside of the logic chip to bond pads on the bonding ledge of the channel chip.

Driver device 55 of the driver assembly outputs the G2-1 signal that is communicated across a bond wire to pad 112 that in turn is coupled down to vertically extending conductor 106 with conductive vias. Driver device 56 of the driver assembly outputs the G2-2 signal that is communicated across a bond wire to pad 113 that in turn is coupled down to vertically extending conductor 107 with conductive vias. Driver device 57 of the driver assembly outputs the G2-3 signal that is communicated across a bond wire to pad 114 that in turn is coupled down to vertically extending conductor 108 with conductive vias.

Figure 33:
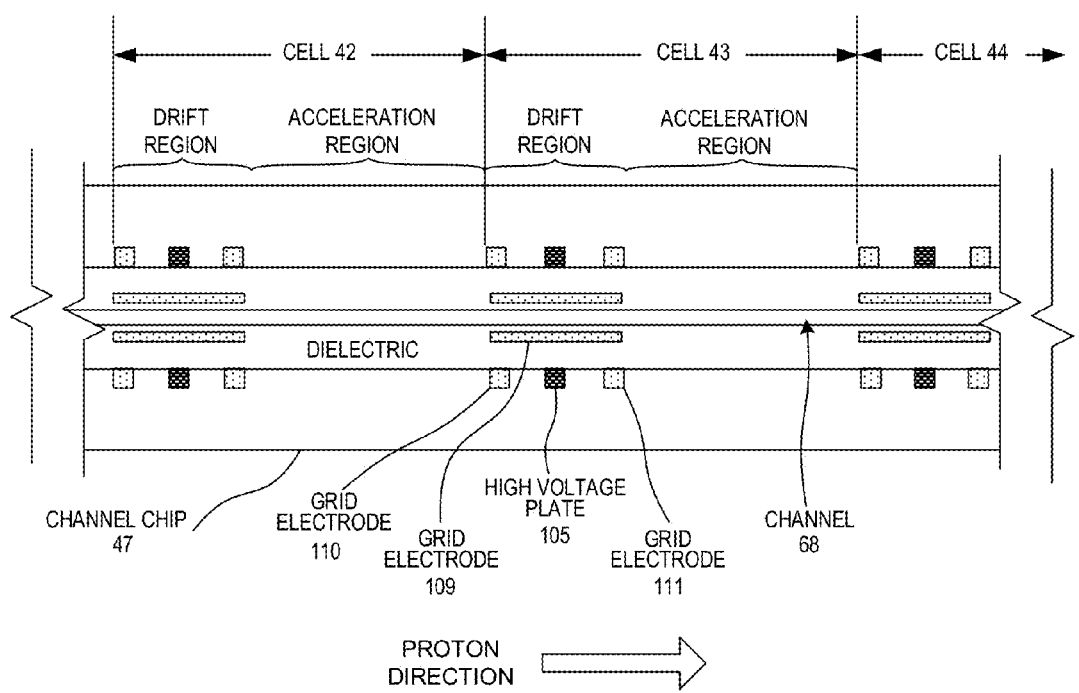
FIG. 33 is a cross-sectional diagram taken along line F-F of FIG. 32.

FIG. 33 is a cross-sectional diagram taken along line F-F of FIG. 32.

Figure 34:
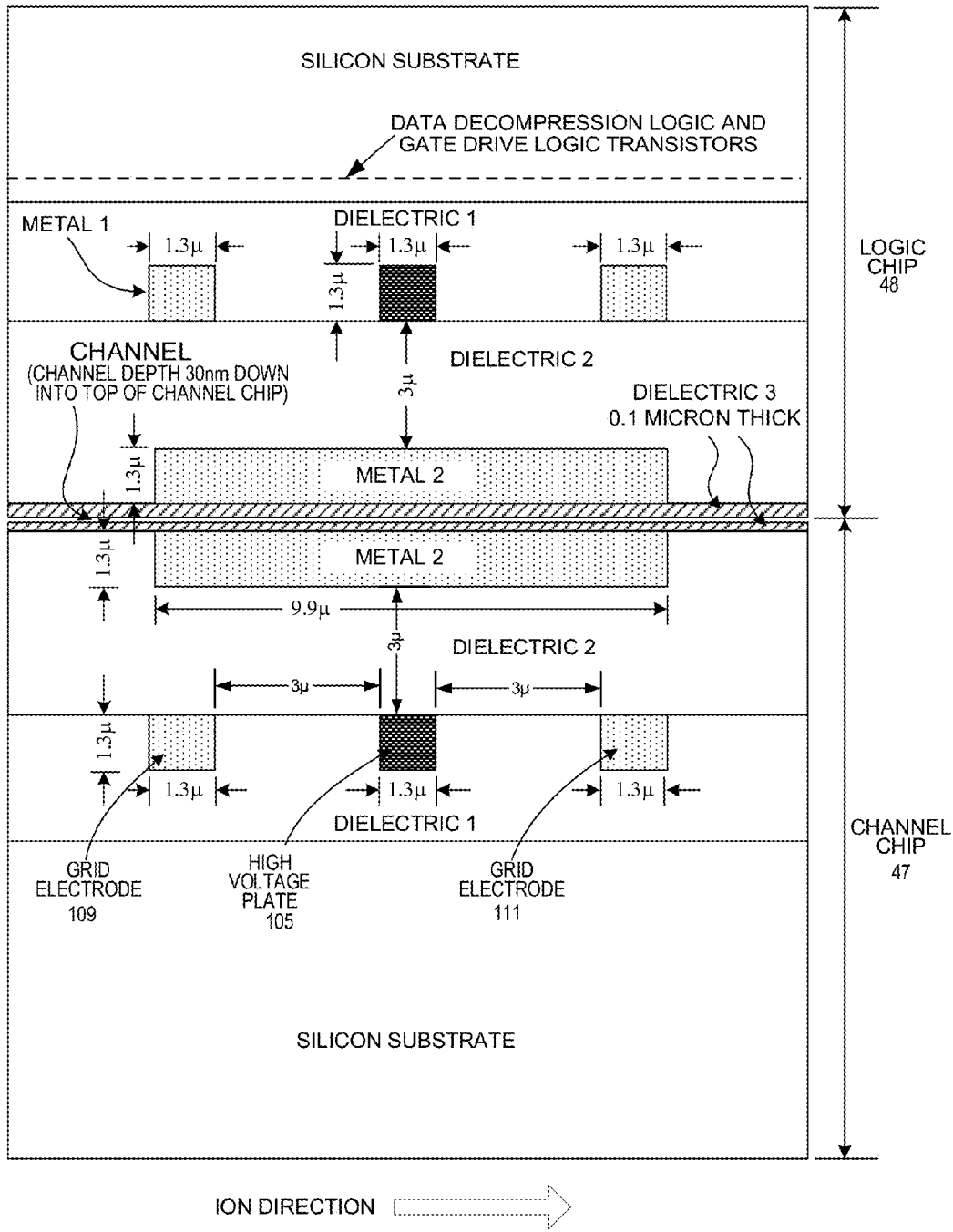
FIG. 34 is a cross-sectional diagram taken along line G-G of FIG. 32.

FIG. 34 is a cross-sectional diagram taken along line G-G of FIG. 32.

Figure 35:
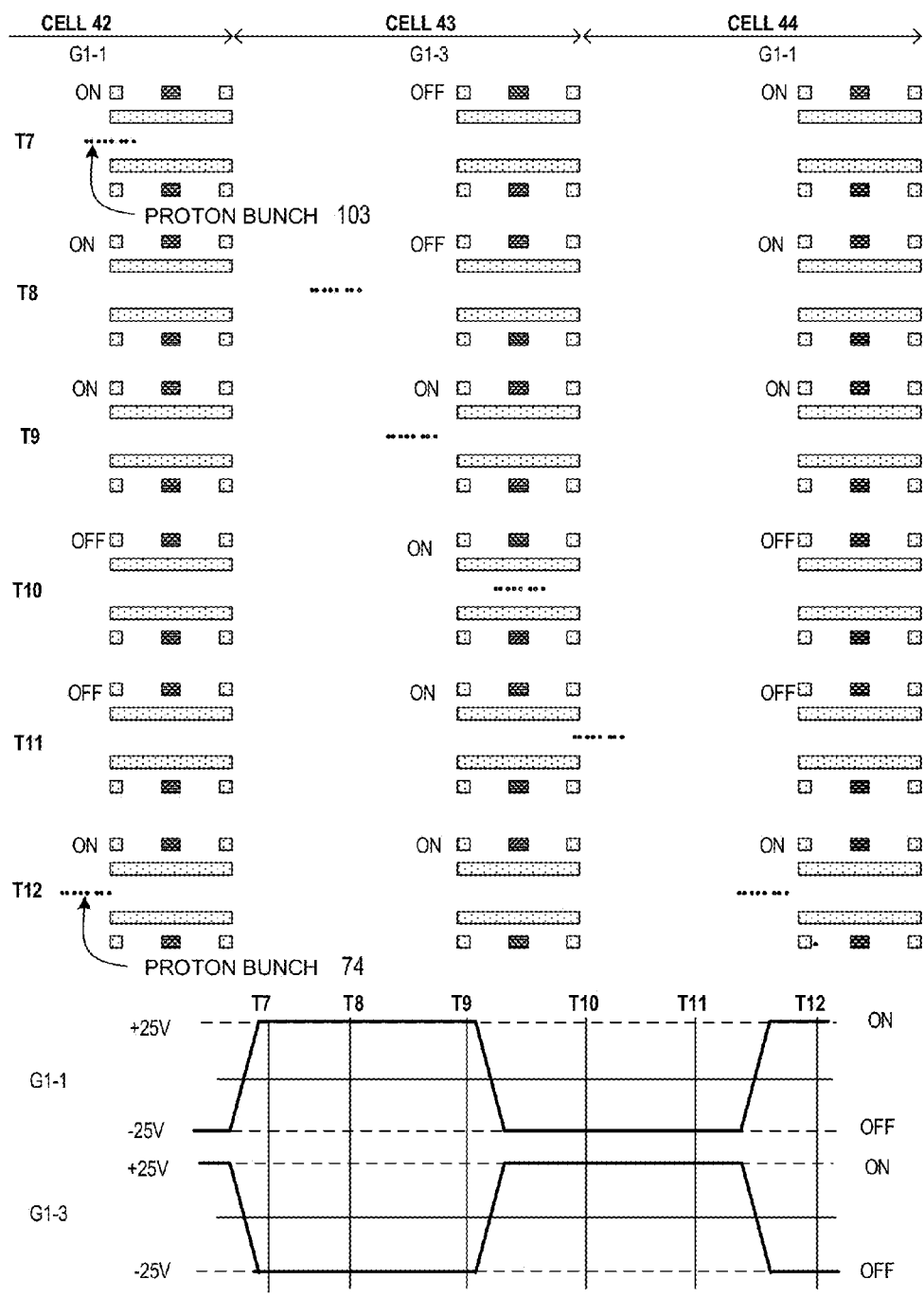
FIG. 35 is a diagram that shows proton bunch 103 traveling down channel 94 of FIG. 29 at a sequence of times T7 through T12.

FIG. 35 is a diagram that shows proton bunch 103 traveling down channel 94 at a sequence of times T7 through T12. The upper diagram shows the position of proton bunch 103 at time T7. At time T7, proton bunch 103 is entering the drift region of cell 42. A +25 volt potential is on the grid electrode of cell 42. The grid electrode is therefore said to be "ON". Protons in proton bunch 103 are not affected by the –500 VDC of the high voltage plate of cell 42 due to the shielding effect of the grid electrode of cell 42. The proton bunch 103 drifts through the drift region of cell 42.

At time T8, proton bunch 103 is in the acceleration region of cell 43. The grid electrode of cell 43 is at –25 volts and is said to be "OFF". Due to the fact that the grid electrode of cell 43 is OFF, protons in bunch 103 are not shielded from the –500 VDC on the high voltage plate of cell 43 but rather are attracted to it. Protons in bunch 103 are, however, shielded from the –500 VDC on the high voltage plate of cell 42 due to the potential on the grid electrode of cell 42 being "ON" at +25 volts. Proton bunch 103 is accelerating. At time T9, +25 volts is on the grid electrode of cell 42, so protons in bunch 103 are shielded from the –500 VDC of the high voltage plate of cell 4, so the protons are not attracted to cell 42. The grid electrode of cell 43 is –25 volts and OFF and must be turned on immediately after T9 such that the proton bunch 103 can enter the drift region of cell 43 unaffected by the −500 VDC on the plate of cell 43.

At time T10, the protons of bunch 103 are in the drift region of cell 43. The protons are shielded from the −500 VDC on the high voltage plate of cell 43 and are drifting.

At time T11, the proton bunch 103 is exiting cell 43 and entering the acceleration region of cell 44. The +25 volts on the grid electrode of cell 43 repels the protons and shields the protons from the effect of the −500 VDC on the high voltage plate of cell 43. The grid electrode of cell 44 is at −25 volts so the protons of bunch 103 are attracted to the −500 VDC of the high voltage plate of cell 44. Proton bunch 103 is accelerating.

At time T12, proton bunch 103 is at the end of the acceleration region of cell 44 and is about to enter the drift region of cell 44. The voltage on the grid electrode of cell 44 is +25 volts, thereby shielding the protons from the −500 VDC of the plate of cell 44. Similarly, the grid electrode of cell 43 is −25 volts, so the protons are no longer shielded from the −500 VDC on the high voltage plate of cell 43. This is in preparation for the drifting of proton bunch 103 into and through the drift region of cell 44. Note that a second proton bunch 74 is illustrated entering cell 42 at this time. Depending on how the gate electrode of the channel was controlled, multiple bunches of protons may be passing down the channel at a given time. The separation between proton bunches in a channel is determined by the initial gating. The maximum gating rate is one GHz. The rate at which lines are written by the overall DWOW printing system 12 is 20 MHz. Lines are written at 40 ns intervals. The X travel rate is 100 mm per second. The exact timing of when to write is established with the X-axis interferometer 29. Since the accelerator is running at 1 GHz, more than one bunch could be emitted out of one channel per line.

In another embodiment, to turn a grid electrode of a cell ON, the grid electrode is driven to a first voltage (for example, a positive voltage) thereby somewhat shielding protons in the channel from the −500 VDC of the high voltage plate of the cell. The grid electrode is then held at this first voltage throughout the time when the shielding is to occur. To turn the grid electrode OFF, the grid electrode is driven to a second voltage (for example, a negative voltage) to add electrons onto the grid electrode, but then the grid electrode is floated for the remainder of the time that the grid is to be OFF. Floating means that the output of the driver that drives the grid electrode is in the high impedance state, and charge can neither be put onto the grid electrode or be taken off the grid electrode. The grid electrode of a cell is controlled in this way to be OFF when a proton bunch is in the acceleration region of the cell, and the grid electrode of the cell is controlled in this way to be ON when a proton bunch is in the drift region of the cell.

FIG. 36 (Prior Art) is a diagram showing a prior attempt at making a proton accelerator 200 for direct write on wafer. A hot ion source 201 emits ions. Typically a tungsten wire is heated in a hydrogen atmosphere to produce a hydrogen ion plasma. Due to the lateral momentum of the protons, the resulting proton beam tends to diverge. Condenser optics 202 focuses the protons to form a collimated beam 203. At this time, the protons are accelerating in an acceleration region. The accelerated beam 203 is then broken up into smaller beams by an aperture plate 204. The resulting smaller beams are then passed through proton gates 205. Each proton gate is controlled either to prevent a beam from passing, or to allow the beam to pass on a target wafer 207. In such a system, primary collimation occurs before beam gating. The protons that are gated are high energy protons because primary acceleration occurs before gating. The best collimators for use in such systems are unable to remove lateral motion in the diverging high energy beam of protons. Due to residual lateral motion after collimation, demagnification and focusing 206 of the gated beams onto photoresist on wafer 207 is less than optimal. As a result, the image on the photoresist tends to be unclear and unfocused.

In a first novel aspect, an assembly 210 includes a cold ion source 211 and a micro-collimator 212. The cold ion source 212 emits cold ions having an energy less than 30 eV. FIG. 37 is a diagram of assembly 210 in abstracted form. In one example, assembly 210 of FIG. 37 is ionjet head 35 of FIG. 10; the micro-collimator 212 of FIG. 37 is the channel chip/logic chip assembly of FIG. 10; and the cold ion source 211 of FIG. 37 is ion injector 46 of FIG. 10. Micro-collimator 212 includes a plurality of closely spaced channels, where each channel has a length and a width. The ratio of the length to the width is at least five, and the width is less than one micron. The cold ion source is coupled to the micro-collimator such that ions from the cold ion source pass through the plurality of channels.

In a second novel aspect, an accelerator assembly 230 includes a chip 232 and a cold ion source 231. FIG. 38 is a diagram of accelerator assembly 230 in abstracted form. An acceleration channel 233 is formed in chip 232, and the cold ion source 231 is bonded to chip 232 so that ions from the cold ion source enter the acceleration channel 233. In one specific example, accelerator assembly 230 of FIG. 38 is ionjet head 35 of FIG. 10; chip 232 of FIG. 38 is channel chip 47 of FIG. 10; and cold ion source 231 of FIG. 38 is ion injector 46 of FIG. 10.

In a third novel aspect, an accelerator assembly 240 includes a plurality of accelerator cells 241 and 242. FIG. 39 is a diagram of accelerator assembly 240 in abstracted form. An acceleration channel 243 passes through each of the plurality of accelerator cells 241 and 242. Each accelerator cell includes an acceleration region and a drift region. Each drift region comprises a high voltage plate and a grid electrode. The grid electrode is disposed at least in part between the high voltage plate and the acceleration channel. The high voltage plate and the grid electrode are embedded in a solid dielectric material 244 and the acceleration channel is formed in the solid dielectric material. Acceleration channel 243 passes in a straight line through the drift region and then through the acceleration region of each accelerator cell. In one example, accelerator assembly 240 of FIG. 39 is ionjet head 35 of FIG. 10; the plurality of accelerator cells 241 and 242 of FIG. 39 are cells 42 and cell 43 of FIG. 33; and the acceleration channel 243 of FIG. 39 is acceleration channel 68 of FIG. 33.

Although an accelerator that comprises grid/plate accelerator cells may be a miniature accelerator as described above, in other embodiments the accelerator is a large, high energy accelerator that is far too large to be realized on a chip. The grid electrode and the high voltage plates of each grid/plate accelerator cell need not be buried in a solid dielectric material and the channel need not be a tubular void in the solid dielectric material, but rather the grid electrode and the high voltage plate may be suspended in a near vacuum or in a gaseous atmosphere. The acceleration channel may also be a volume in the near vacuum or gaseous atmosphere. In one example of a large high energy accelerator that employs the grid/plate accelerator cell architecture, a long tube of glass extends in a straight line through numerous grid/plate accelerator cells. The central volume of this long tube is a low pressure atmosphere or vacuum that forms the channel. The grid electrodes and high voltage plate are strips of metal disposed outside the glass tube. The grid electrodes and the high voltage plates may, for example, be carried on a material other than the dielectric layer on a chip. For example, the grid electrodes and the high voltage plates can be metal traces on a printed circuit board or on another printed circuit structure. The grid/plate accelerator cell architecture is not limited to use in miniature proton accelerators, to use in low power accelerators, or to use in a wafer writer application, but rather is of general applicability.

Figure 40:
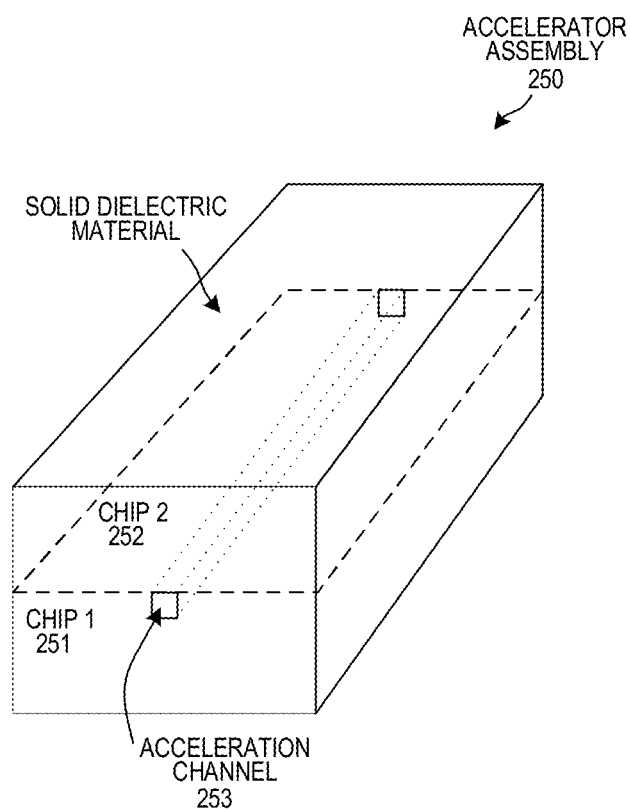
FIG. 40 is a diagram of accelerator assembly 250 in abstracted form.

In a fourth novel aspect, an accelerator assembly 250 includes a first chip 251 and a second chip 252. FIG. 40 is a diagram of accelerator assembly 250 in abstracted form. An acceleration channel 253 is formed into the surface of first chip 251, and the first and second chips are covalently bonded together as shown such that the acceleration channel 253 is a tubular void between the first and second chips. In one example, accelerator assembly 250 of FIG. 40 is ionjet head 35 of FIG. 10; first chip 251 of FIG. 40 is channel chip 47 of FIG. 22; second chip 252 of FIG. 40 is logic chip 48 of FIG. 22; and acceleration channel 253 of FIG. 40 is acceleration channel 68 of FIG. 22.

Figure 41:
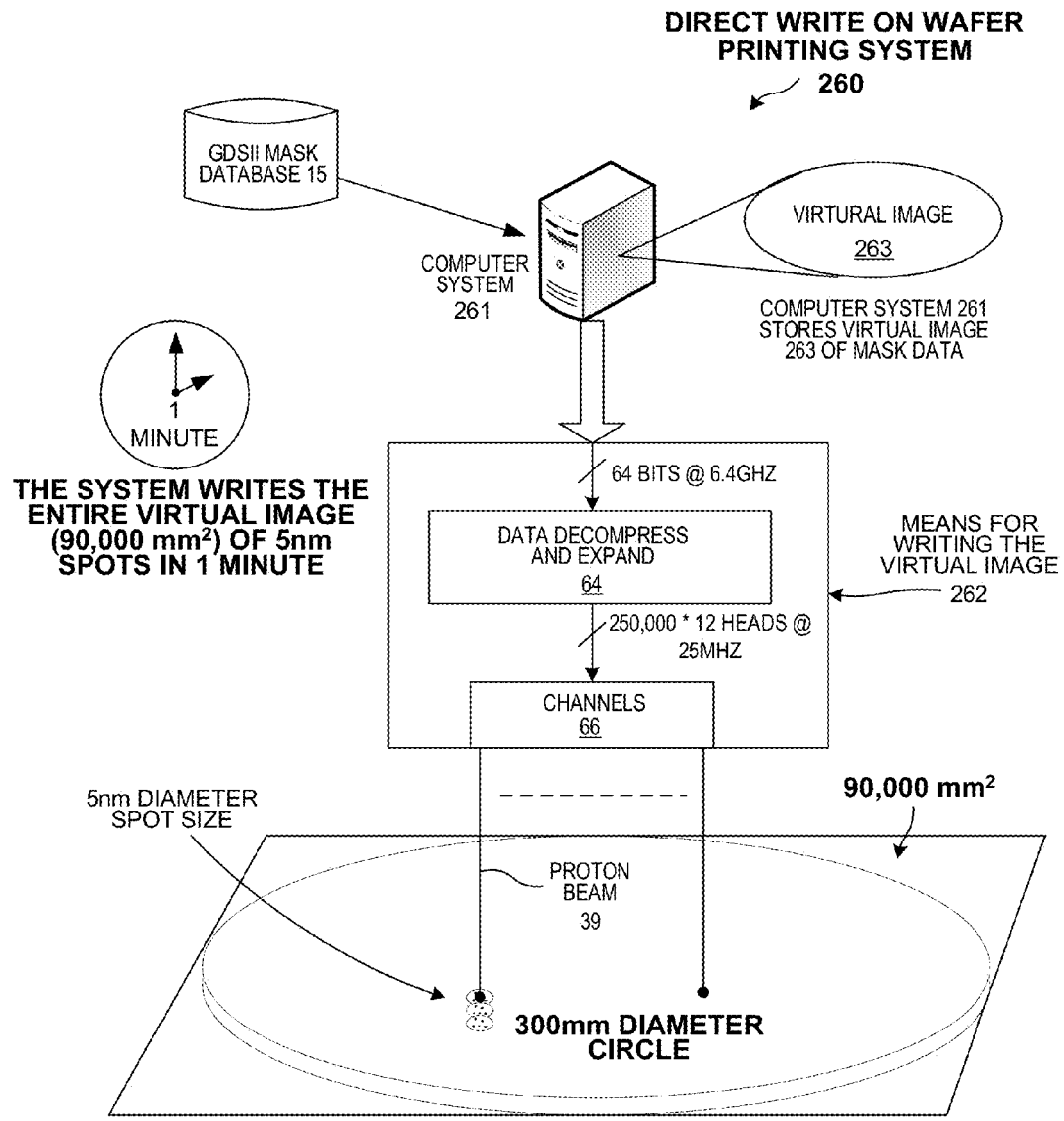
FIG. 41 is a diagram of DWOW printing system 260 in abstracted form.

In a fifth novel aspect, a Direct Write On Wafer (DWOW) Printing System 260 includes a computer system 261 and a means for writing 262. FIG. 41 is a diagram of DWOW printing system 260 in abstracted form. Computer system 261 stores a virtual image 263. The means for writing 262 writes the virtual image 263 in an area of at least 90,000 square millimeters in less than one minute by selectively irradiating individual spots with a spot irradiation of at least 0.2 picojoules (40 protons at 10 KeV). Each individual spot has a spot size of 5 nm diameter or less. In one example, DWOW printing system 260 of FIG. 41 is printing system 12 of FIG. 6; computer system 261 of FIG. 41 is computer 14 of FIG. 6; and means for writing 262 of FIG. 41 is wafer printer 13, wafer transport control device 17, power supply 86, raster memory device 18, and hydrogen gas source 19 of FIG. 6. Ions come off the acceleration channels with an energy of between 50 eV and 20 MeV, and more particularly between 1 KeV and 20 MeV, and preferably for the specific embodiment at 10 KeV. Although an embodiment of a DWOW printing system is described above that employs both drift plate accelerator cells and grid/plate accelerator cells, in other embodiments the DWOW printing system employs only drift plate accelerator cells, or only grid/plate accelerator cells, or another type of accelerator cell. Ions other than protons can be accelerated and DWOW printed. Ions that may be DWOW printed using techniques described here include, but are not limited to, helium ions, lithium ions, carbon ions, beryllium ions, phosphorous ions, and boron ions.

Although certain specific embodiments are described above for instructional purposes, the teachings of this patent document have general applicability and are not limited to the specific embodiments described above. Although a DWOW printing system is described above where the substrate being written is a semiconductor wafer, the substrate being written is not limited to that particular example but rather in other embodiments may, for example, be a mask such as is used in the manufacture of semiconductor wafers, or a flat panel blank such as is used as a substrate in the manufacture of flat panel displays and televisions. The system is modular and is scalable in size and can be made to write very large surfaces by adding additional ionjet heads. Accordingly, various modifications, adaptations, and combinations of various features of the described embodiments can be practiced without departing from the scope of the invention as set forth in the claims.

What is claimed is:

1. An accelerator assembly, comprising:
    a first layer with a first planar surface, wherein an acceleration channel is formed into the first planar surface; and
    a second layer with a second planar surface, wherein the second planar surface is fusion bonded to the first planar surface such that the acceleration channel is a tubular void between the first layer and the second layer.

2. The accelerator assembly of claim 1, wherein the first layer is silicon dioxide deposited on a substrate taken from the group consisting of: a semiconductor substrate, a glass substrate, an alumina substrate, a sapphire substrate and a ceramic substrate.

3. The accelerator assembly of claim 1, wherein the accelerator assembly accelerates an ion that is passing through the acceleration channel.

4. The accelerator assembly of claim 1, wherein a bond wire connects a first part of an electrode in the first layer to a second part of the electrode in the second layer, and wherein the electrode is an electrode of an accelerator cell of the accelerator assembly.

5. The accelerator assembly of claim 1, wherein the acceleration channel extends in a straight line.

6. The accelerator assembly of claim 5, wherein the acceleration channel is one of a plurality of substantially identical acceleration channels, and wherein the substantially identical acceleration channels extend parallel to one another.

7. The accelerator assembly of claim 1, wherein the acceleration channel extends through a plurality of accelerator cells, wherein each accelerator cell includes an acceleration region and a drift region, wherein a first part of each drift region is disposed in the first layer, and wherein a second part of each drift region is disposed in the second layer.

8. The accelerator assembly of claim 1, wherein the second layer is deposited on a substrate, further comprising:
    a Peltier cooler that is attached to the substrate.

9. The accelerator assembly of claim 1, wherein the acceleration channel has a cross-sectional area of less than one square micron.

10. The accelerator assembly of claim 1, wherein the acceleration channel has a length, a width, and a depth, wherein the ratio of the length to the width is more than five, and wherein the product of the width and depth is less than about one square micron.

11. The accelerator assembly of claim 1, wherein the second layer is deposited on a substrate, and wherein a transistor is formed on the substrate.

12. The accelerator assembly of claim 1, wherein the acceleration channel has an inside sidewall surface, and wherein substantially no portion of the inside sidewall surface is a metal surface.

13. The accelerator assembly of claim 1, wherein a bond wire extends from the first layer to the second layer.

14. A method comprising:
    making a bonded chip structure, wherein the bonded chip structure comprises a first chip and a second chip, wherein the first chip has a first side, wherein an acceleration channel is formed into a surface of the first side, wherein the second chip has a second side, and wherein a surface of the second side is fusion bonded to the surface of the first side such that the acceleration channel is a tubular volume between the first chip and the second chip.

15. The method of claim 14, wherein the surface of the first side is a silicon dioxide layer deposited onto the first chip, and wherein the acceleration channel is formed in the silicon dioxide layer.

16. The method of claim 14, wherein the making of the bonded chip structure involves bonding a first wafer to a second wafer to make a wafer bonded structure, and then sectioning the wafer bonded structure to form the bonded chip structure.

17. The method of claim 14, wherein the bonded chip structure includes a plurality of accelerator cells, and wherein the acceleration channel extends in a straight line through each of the plurality of accelerator cells.

18. An accelerator assembly, comprising:
a first silicon dioxide layer, wherein an acceleration channel is formed into a first surface of the silicon dioxide layer; and
a second silicon dioxide layer, wherein a second surface of the second silicon dioxide layer is bonded to the first surface such that the acceleration channel is a tubular void between the first silicon dioxide layer and the second silicon dioxide layer, wherein the accelerator assembly comprises a plurality of substantially identical parallel extending acceleration channels, wherein a drift plate extends perpendicularly to each of the substantially identical acceleration channels, wherein a first part of the drift plate is disposed in the first silicon dioxide layer, wherein a second part of the drift plate is disposed in the second silicon dioxide layer, and wherein the first and second parts of the drift plate are electrically coupled together.

19. The accelerator assembly of claim 18, further comprising means for individually gating each acceleration channel.

20. The accelerator assembly of claim 18, wherein each acceleration channel has an associated gate electrode, and wherein each of the gate electrodes is individually controllable to determine whether ions pass down the acceleration channel associated with the gate electrode.

* * * * *